United States Patent
Ohyu

(10) Patent No.: US 11,561,273 B2
(45) Date of Patent: Jan. 24, 2023

(54) MEDICAL IMAGE PROCESSING APPARATUS AND METHOD

(71) Applicant: Canon Medical Systems Corporation, Otawara (JP)

(72) Inventor: Shigeharu Ohyu, Yaita (JP)

(73) Assignee: Canon Medical Systems Corporation, Otawara (JP)

( * ) Notice: Subject to any disclaimer, the term of this patent is extended or adjusted under 35 U.S.C. 154(b) by 185 days.

(21) Appl. No.: 16/951,492

(22) Filed: Nov. 18, 2020

(65) Prior Publication Data

US 2021/0165063 A1 Jun. 3, 2021

(30) Foreign Application Priority Data

Nov. 29, 2019 (JP) .............................. JP2019-217322

(51) Int. Cl.
| | | |
|---|---|---|
| *G01R 33/563* | (2006.01) | |
| *G01R 33/56* | (2006.01) | |
| *G01R 33/58* | (2006.01) | |

(52) U.S. Cl.
CPC ............... *G01R 33/56316* (2013.01); *G01R 33/5601* (2013.01); *G01R 33/5608* (2013.01); *G01R 33/58* (2013.01)

(58) Field of Classification Search
None
See application file for complete search history.

(56) References Cited

U.S. PATENT DOCUMENTS

| | | | |
|---|---|---|---|
| 2010/0113914 A1* | 5/2010 | Kabasawa | .......... G01R 33/5601 600/419 |
| 2012/0082359 A1 | 4/2012 | Arditi et al. | |
| 2019/0180440 A1* | 6/2019 | Matsumoto | .......... A61B 6/5211 |
| 2021/0042915 A1* | 2/2021 | Bernat | .................. G06V 10/82 |

FOREIGN PATENT DOCUMENTS

| | | | | |
|---|---|---|---|---|
| JP | 2010-075634 A | | 4/2010 | |
| JP | 2010201154 A | * | 9/2010 | ............. A61B 5/055 |
| JP | 2010269127 A | * | 12/2010 | ........... A61B 5/0263 |
| JP | 2012-529320 A | | 11/2012 | |

OTHER PUBLICATIONS

Karahaliou et al., "Assessing Heterogeneity of Lesion Enhancement Kinetics in Dynamic Contrast-Enhanced MRI for Breast Cancer Diagnosis", The British Journal of Radiology, 83 (Apr. 2010), 22 pages.

* cited by examiner

*Primary Examiner* — Rodney E Fuller
(74) *Attorney, Agent, or Firm* — Oblon, McClelland, Maier & Neustadt, L.L.P.

(57) ABSTRACT

A medical image processing apparatus including processing circuitry configured to obtain MR dynamic images acquired by MR imaging on a subject, in which a contrast agent has been injected, in accordance with an examination-time imaging condition including magnetic field information, contrast agent information, and/or tissue information, set a standard imaging condition, and calculate a first index value indicating a temporal change of an MR signal value caused by the contrast agent, the index value being standardized by conversion from the examination-time imaging condition to the standard imaging condition based on the MR dynamic images, the examination-time imaging condition, and the standard imaging condition.

13 Claims, 8 Drawing Sheets

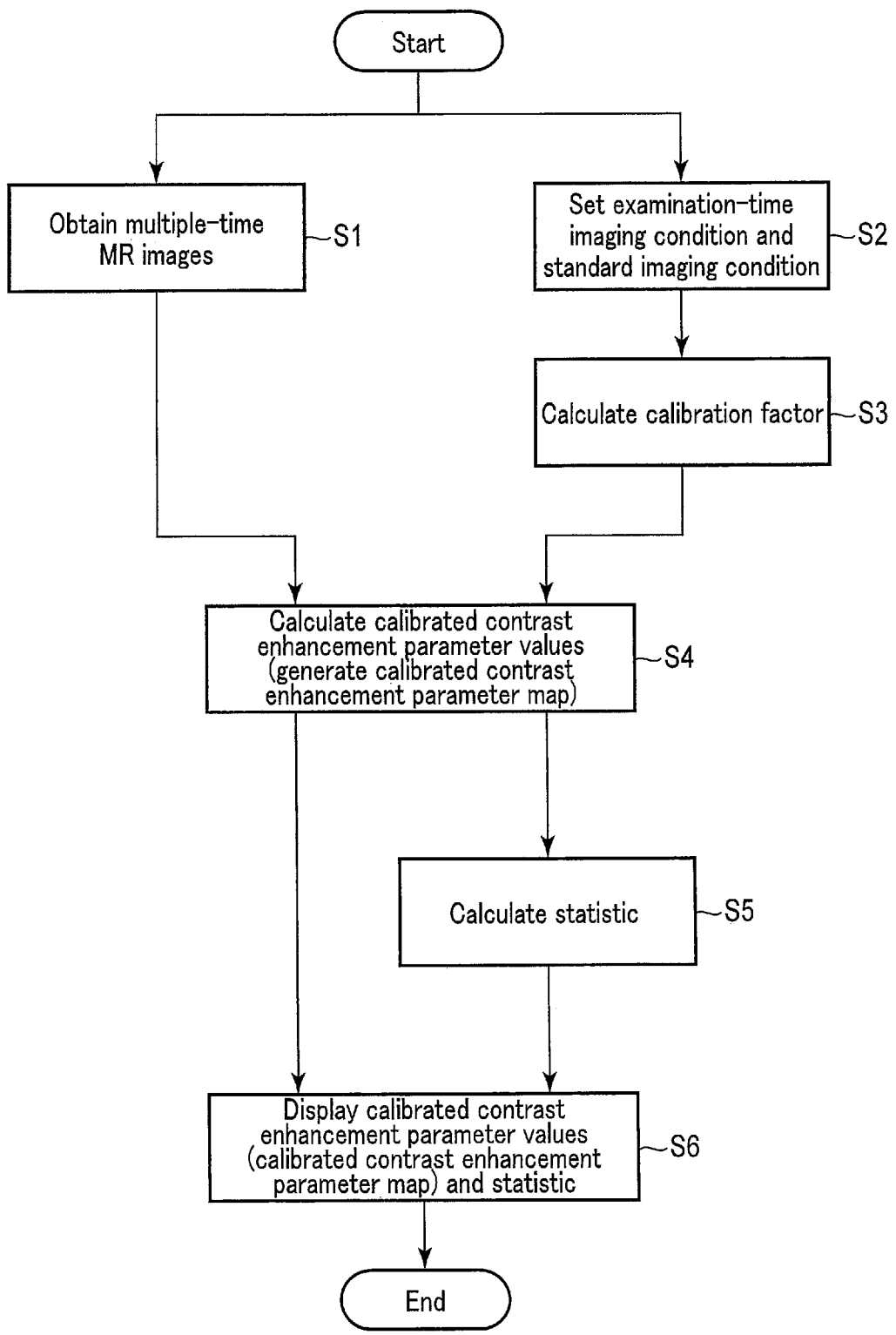
F I G. 2

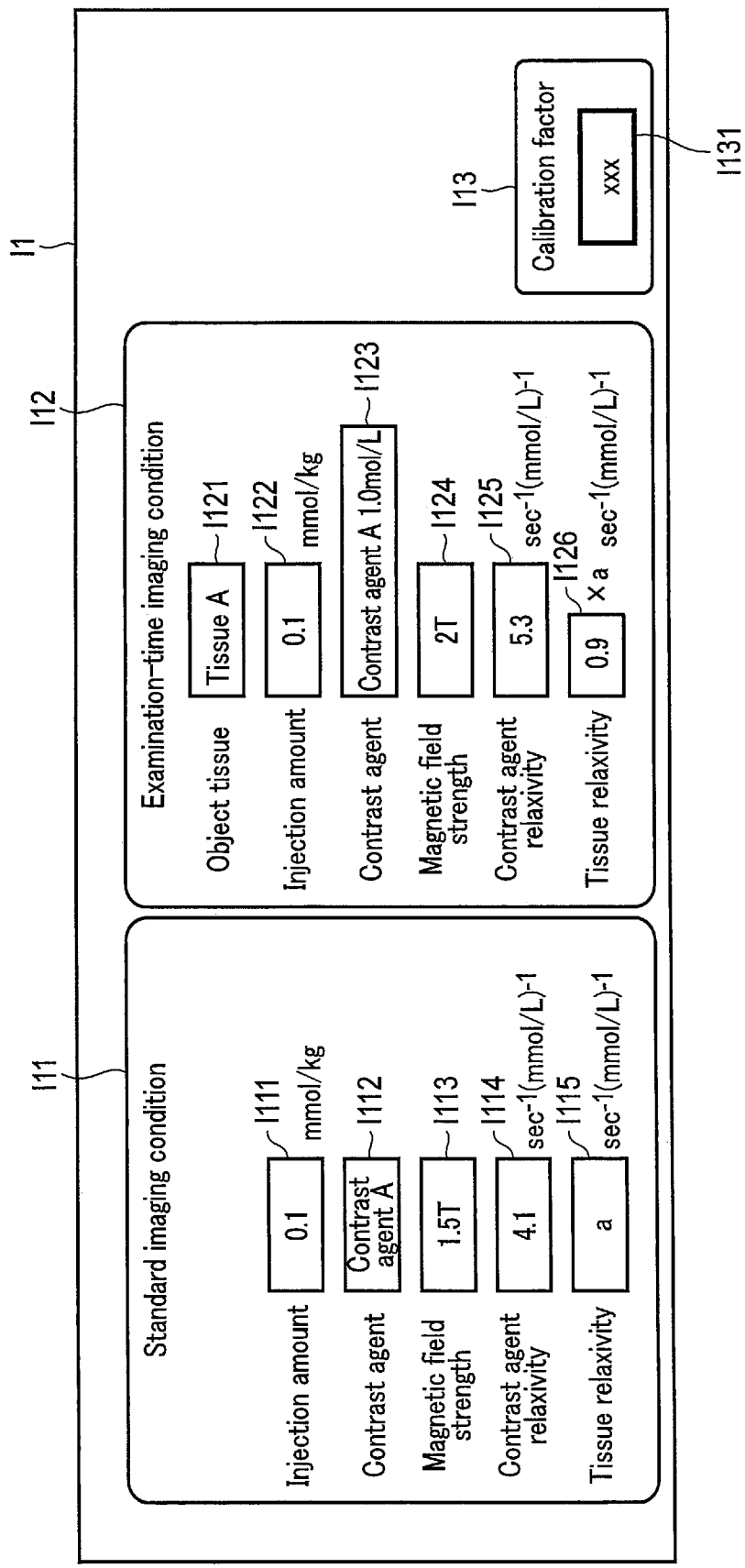
F I G. 3

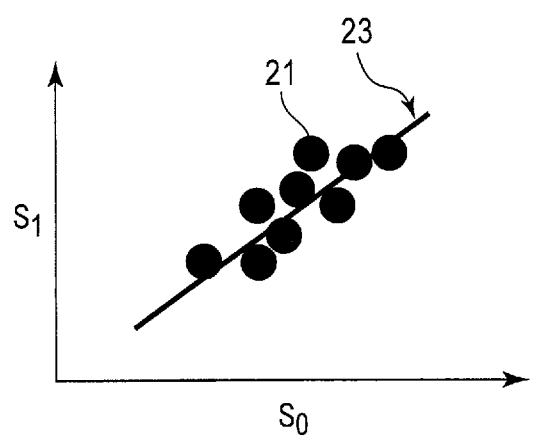
F I G. 5

MEDICAL IMAGE PROCESSING APPARATUS AND METHOD

CROSS-REFERENCE TO RELATED APPLICATIONS

This application is based upon and claims the benefit of priority from the prior Japanese Patent Application No. 2019-217322, filed Nov. 29, 2019, the entire contents of which are incorporated herein by reference.

FIELD

Embodiments described herein relate generally to a medical image processing apparatus and method.

BACKGROUND

Software for generating, from MR images acquired by contrast-enhanced MR examinations, a contrast enhancement parametric map that expresses distribution of values of indexes (hereinafter referred to as contrast enhancement parameters) that indicate a temporal change of a contrast agent is on the market. Statistics such as an average value of a lesion in the contrast enhancement parametric map are used for diagnosis. However, contrast enhancement parameter values inevitably vary depending on the imaging conditions, such as the magnetic field strength, the contrast agent type, and the contrast agent injection amount; therefore, upon diagnosis using contrast enhancement parameters, the dependency of contrast enhancement parameter values on the imaging conditions inhibits correct diagnosis.

BRIEF DESCRIPTION OF THE DRAWINGS

FIG. 2 is a diagram showing a typical flow of analysis processing of time-series MR images by the medical image processing apparatus.

FIG. 3 is a diagram showing an example of an imaging condition input window according to calibration factor determination example 1.

FIG. 5 is a diagram showing an example of a scatter diagram based on signal values of a non-contrast-enhanced image relating to a reference tissue and signal values of an initial contrast-enhanced image relating to the reference tissue.

DETAILED DESCRIPTION

According to one embodiment, a medical image processing apparatus includes processing circuitry. The processing circuitry obtains first dynamic MR images at multiple-time-points acquired by MR imaging on a subject, in which a contrast agent has been injected, in accordance with an imaging condition used in the examination including magnetic field information, contrast agent information, and/or tissue information. Hereafter, the imaging condition used in the examination is noted as examination-time imaging condition. The processing circuitry sets a standard imaging condition including magnetic field information, contrast agent information and/or tissue information. The processing circuitry calculates a first index value indicating a temporal change of an MR signal value caused by the contrast agent, the first index value being standardized by conversion from the examination-time imaging condition to the standard imaging condition based on the first dynamic MR images, the examination-time imaging condition, and the standard imaging condition.

In the following descriptions, a medical image processing apparatus and method according to the present embodiment will be described with reference to the accompanying drawings.

The medical image processing apparatus according to the present embodiment is a computer configured to process an MR image generated by a magnetic resonance imaging apparatus. The medical image processing apparatus may be a computer integrated in the magnetic resonance imaging apparatus or a computer separate from the magnetic resonance imaging apparatus. In the following embodiment, let us assume that the medical image processing apparatus is a computer separate from the magnetic resonance imaging apparatus.

Figure 1:
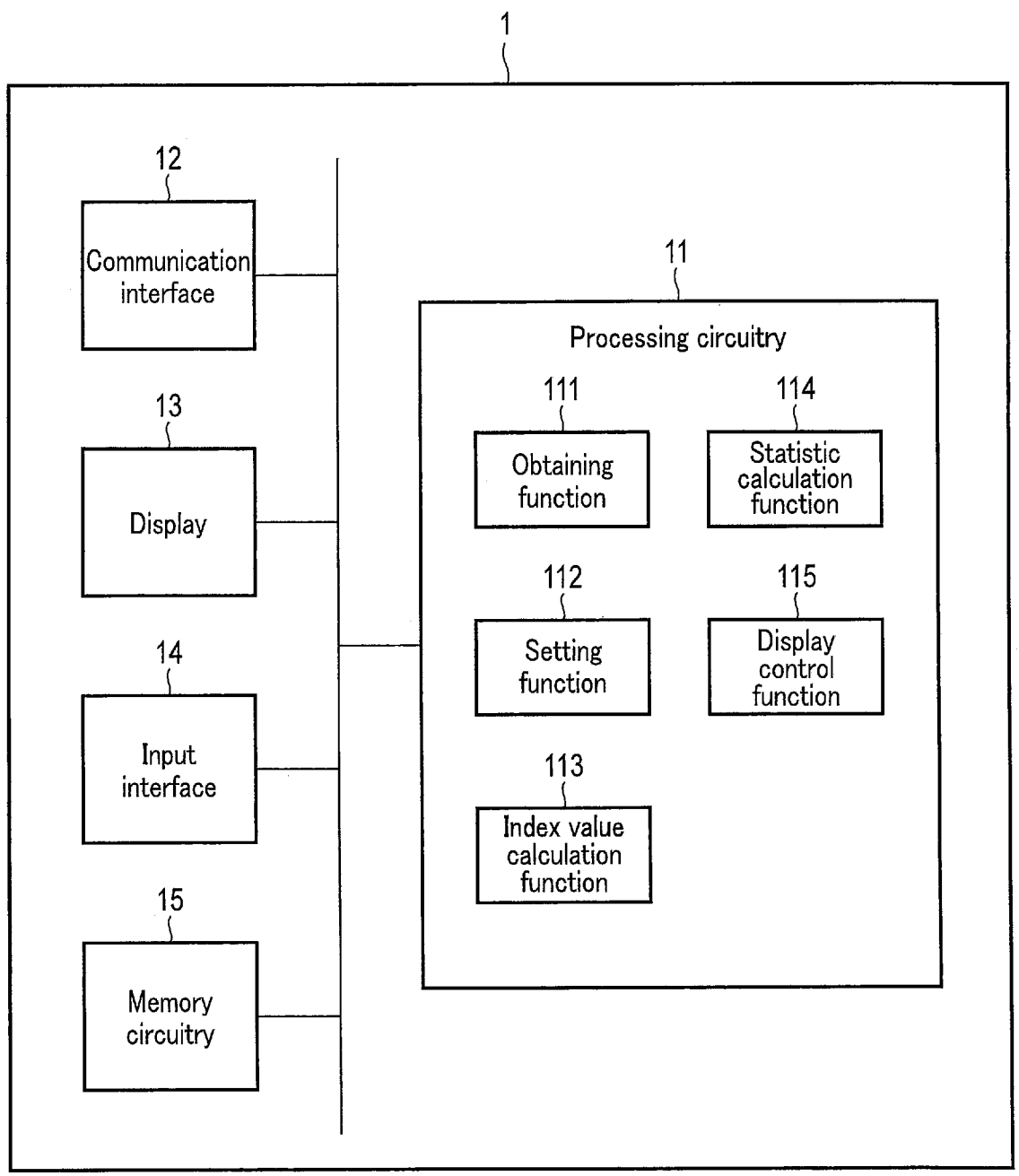
FIG. 1 is a diagram showing a configuration of a medical image processing apparatus according to a present embodiment.

FIG. 1 is a diagram showing a configuration of a medical image processing apparatus 1 according to the present embodiment. As shown in FIG. 1, the medical image processing apparatus 1 includes processing circuitry 11, a communication interface 12, a display 13, an input interface 14, and memory circuitry 15.

The processing circuitry 11 includes a processor, such as a CPU or a GPU. The processor activates various programs installed in the memory circuitry 15 or the like, thereby implementing an obtaining function ill, a setting function 112, an index value calculation function 113, a statistic calculation function 114, and a display control function 115. Each of the functions 111 to 115 is not necessarily implemented by a single processing circuit. A plurality of independent processors may be combined into processing circuitry, and execute programs to implement the respective functions 111 to 115.

Through implementation of the obtaining function 111, the processing circuitry 11 obtains dynamic MR images consists of multiple-time-points MR images acquired by MR imaging on a subject in which a contrast agent has been injected. The MR images may be obtained from the magnetic resonance imaging apparatus, a picture archiving and communication system (PACS), or the like, via the communication interface 12, a portable storage medium, or the like, or may be obtained from the memory circuitry 15, which stores MR images received via the communication interface 12, a portable storage medium, or the like. The processing circuitry 11 can also obtain various information other than the dynamic MR images.

The first dynamic MR images to be obtained are generated through dynamic imaging by the magnetic resonance imaging apparatus according to a preset examination-time imaging condition. The imaging condition according to the present embodiment includes magnetic field information, contrast agent information, and/or tissue information. Typically, the magnetic field information is information on static field strength of the magnetic resonance imaging apparatus.

The contrast agent information includes the type, injection amount, and relaxivity of a contrast agent. The tissue information includes the type and relaxivity of a tissue included in the subject, and information on the strength of an MRI signal observed at the tissue. Data of the examination-time imaging condition is associated with the first dynamic MR images. For MR imaging, other information may be set as the imaging condition.

Through implementation of the setting function 112, the processing circuitry 11 sets a standard imaging condition including magnetic field information, contrast agent information, and/or tissue information. The imaging condition of MR imaging actually performed on a subject may differ from the standard imaging condition. The processing circuitry 11 sets an examination-time imaging condition including magnetic field information, contrast agent information, and/or tissue information. The examination-time imaging condition is an imaging condition of MR imaging actually performed on a subject.

Through implementation of the index value calculation function 113, the processing circuitry 11 calculates a value of a contrast enhancement parameter indicating a temporal change of an MR signal value caused by the contrast agent, which has been standardized by conversion from the examination-time imaging condition to the standard imaging condition, on the basis of the first dynamic MR images, the examination-time imaging condition, and the standard imaging condition. The processing circuitry 11 calculates a contrast enhancement parameter value for each pixel of the MR images. Spatial distribution of the contrast enhancement parameter values is called a contrast enhancement parametric map. In other words, through implementation of the index value calculation function 113, the processing circuitry 11 can generate a contrast enhancement parametric map. The contrast enhancement parameter is also referred to as a dynamic contrast-enhanced (DCE) parameter.

Through implementation of the statistic calculation function 114, the processing circuitry 11 calculates a statistics based on the contrast enhancement parameter values of the contrast enhancement parametric map calculated by the index value calculation function 113. The statistics may be calculated based on the parameter values of respective pixels included in the entire region of the contrast enhancement parametric map, or may be calculated based on the parameter values of respective pixels included in a region of interest of the contrast enhancement parametric map.

Through implementation of the display control function 115, the processing circuitry 11 causes the display 13 to display various types of information. For example, the processing circuitry 11 causes the display 13 to display the statistics calculated by the statistic calculation function 114, the contrast enhancement parameter values or contrast enhancement parametric map calculated by the index value calculation function 113, the first dynamic MR images obtained by the obtaining function 111, and the like. The processing circuitry 11 may also cause the display 13 to display an input window for the setting function 112 to input imaging conditions.

The communication interface 12 is an interface for information communication with the magnetic resonance imaging apparatus, PACS, and other computers.

The display 13 displays various types of information in accordance with the display control function 115 of the processing circuitry 11. As the display 13, a liquid crystal display (LCD), a cathode ray tube (CRT) display, an organic electroluminescence display (OELD), a plasma display, or any other display may be used as appropriate. The display 13 may be a projector.

The input interface 14 receives various input operations from a user, converts a received input operation into an electrical signal, and outputs the electrical signal to the processing circuitry 11. Specifically, the input interface 14 is connected to an input device, such as a mouse, a keyboard, a trackball, a switch, a button, a joystick, a touch pad, or a touch panel display. The input interface 14 may be a voice-input device using a voice signal from an input device, such as a microphone, which collects sound. The input interface 14 may be non-contact input circuitry using an optical sensor. The input interface 14 outputs to the processing circuitry 11 an electrical signal corresponding to an input operation on the input device. Furthermore, the input device connected to the input interface 14 may be an input device provided in a separate computer connected via a network or the like.

The memory circuitry 15 is a storage device for storing various types of information, such as a read only memory (ROM), a random access memory (RAM), a hard disk drive (HDD), a solid state drive (SSD), or an integrated circuit storage device. The memory circuitry 15 stores, for example, the dynamic MR images, the standard imaging condition, and the examination-time imaging condition. Instead of the above storage device, the memory circuitry 15 may be a driver that reads and writes various types of information from and to a semiconductor memory device or a portable storage medium such as a compact disc (CD), a digital versatile disc (DVD), a flash memory, or the like. The memory circuitry 15 may be provided in another computer connected to the medical image processing apparatus 1 via a network.

Hereinafter, the medical data processing apparatus 1 will be described in detail.

First, pre-processing of the calculation of contrast enhancement parameters will be described. As the pre-processing, a contrast-enhanced image is generated based on first dynamic MR images consists of multiple-time-points MR images obtained in contrast-enhanced MR examinations. In the present embodiment, the value of an MR signal and the value of a pixel of an image are not particularly distinguished from each other, and will be referred to as a signal value.

The signal value of one pixel of an MR image at time $u_i$ (where i=0, . . . , and N) will be denoted as $S(u_i)$. The time-series of MR images can be divided into images before contrast agent injection and those after contrast agent injection. The period from time $u_0$ to time $u_{N0}$ is referred to as "before contrast agent injection", and the period from time $u_{N0+1}$ to time $u_N$ is referred to as "after contrast agent injection". The signal value $S_0$ of an image before contrast agent injection (hereinafter referred to as a non-contrast-enhanced image) is calculated in accordance with equation (1) on the basis of weight $w_{0,i}$ and signal values $S(u_i)$ of MR images from time $u_0$ to time $u_{N0}$.

$$S_0 = \sum_{i=0}^{N_0} w_{0,i} S(u_i) \tag{1}$$

The signal value $S_1$ of an initial contrast-enhanced image corresponding to elapsed time $t_1$ since contrast agent injection is calculated in accordance with equation (2) on the basis of weight $w_{1,i}$ and signal values $S(u_i)$ of MR images from time $u_0$ to time $u_N$. The weight $w_{1,i}$ takes a large value when $u_i$ is close to $t_1$. The elapsed time $t_i$ corresponds to the initial stage of contrast enhancement.

$$S_1 = \sum_{i=0}^{N} w_{1,i} S(u_i) \qquad (2)$$

The signal value $S_2$ of the post-initial contrast-enhanced image corresponding to elapsed time $t_2$ since contrast agent injection is calculated in accordance with equation (3) on the basis of weight $w_{2,i}$ and signal values $S(u_i)$ of MR images from time $u_0$ to time $u_N$. The weight $w_{2,i}$ takes a large value when $u_i$ is close to $t_2$. The elapsed time $t_2$ corresponds to the post-initial stage of contrast enhancement.

$$S_2 = \sum_{i=0}^{N} w_{2,i} S(u_i) \qquad (3)$$

The signal value $S_p$ of a peak contrast-enhanced image is calculated in accordance with equation (4) on the basis of weight $w_{p,i}$ and signal values $S(u_i)$ of MR images from time $u_0$ to time $u_N$. The weight $w_{p,i}$ takes a large value near $u_i$ of when $S(u_i)$ is the maximum.

$$S_p = \sum_{i=0}^{N} w_{p,i} S(u_i) \qquad (4)$$

The signal value $S_{ms2}-S_{ms1}$ of a differential image before and after the maximum slope is calculated in accordance with equation (5). The signal value $S_{ms2}$ of a post-maximum slope image is calculated on the basis of weight $w_{ms2,i}$ and signal values $S(u_i)$ of MR images from time $u_0$ to time $u_N$, as shown in the first term of the right side of equation (5). The weight $w_{ms2,i}$ takes a large value near time $t_{ms2}$ after $S(u_i)$ has the maximum slope. The signal value $S_{ms1}$ of a pre-maximum slope image is calculated on the basis of weight $w_{ms1,i}$ and signal values $S(u_i)$ of MR images from time $u_0$ to time $u_N$, as shown in the second term of the right side of equation (5). The weight $w_{ms1,i}$ takes a large value near time $t_{ms1}$ before $S(u_i)$ has the maximum slope. The signal value $S_{ms2}-S_{ms1}$ of the differential image before and after the maximum slope is calculated by subtracting the signal value $S_{ms1}$ of the pre-maximum slope image from the signal value $S_{ms2}$ of the post-maximum slope image, as shown in equation (5).

$$S_{ms2} - S_{ms1} = \sum_{i=0}^{N} w_{ms2,i} S(u_i) - \sum_{i=0}^{N} w_{ms1,i} S(u_i) \qquad (5)$$

The above equations are those of one pixel, but signal values of a plurality of pixels are calculated by applying the same calculations to the pixels.

Various contrast enhancement parameters indicating a signal value change of a tissue by a contrast agent are calculated from the signal values $S(u_i)$ of contrast-enhanced images as follows. As shown below, various enhancement parameters are expressed by a ratio of a signal value at one point in time to a signal value at another point in time. This is because of the particularity of MR images, which have no quantification in the signal value itself.

An initial enhancement (IE) is calculated in accordance with equation (6) on the basis of the signal value $S_0$ of the non-contrast-enhanced image and the signal value $S_1$ of the initial contrast-enhanced image.

$$IE\ (\%) = 100 \times \frac{S_1 - S_0}{S_0} \qquad (6)$$

A peak percentage enhancement (PPE) is calculated in accordance with equation (7) on the basis of the signal value $S_p$ of the peak contrast-enhanced image and the signal value $S_0$ of the non-contrast-enhanced image.

$$PPE\ (\%) = 100 \times \frac{S_p - S_0}{S_0} \qquad (7)$$

A post initial enhancement (PIE) is calculated in accordance with equation (8) on the basis of the signal value $S_2$ of the post-initial contrast-enhanced image and the signal value $S_1$ of the initial contrast-enhanced image.

$$PIE\ (\%) = 100 \times \frac{S_2 - S_1}{S_1} \qquad (8)$$

A signal enhancement ratio (SER) is calculated in accordance with equation (9) on the basis of the signal value $S_2$ of the post-initial contrast-enhanced image, the signal value $S_1$ of the initial contrast-enhanced image, and the signal value $S_0$ of the non-contrast-enhanced image.

$$SER\ (\%) = 100 \times \frac{S_1 - S_0}{S_2 - S_0} \qquad (6)$$

A maximum slope (MS) is calculated in accordance with equation (10) on the basis of the signal value $S_{ms2}-S_{ms1}$ of a differential image between the post-maximum slope image and the pre-maximum slope image, the signal value $S_0$ of the non-contrast-enhanced image, and the elapsed time difference $t_{ms2}-t_{ms1}$ before and after the maximum slope. The signal value of the pre-maximum slope image is denoted as $S_{ms2}$, and the signal value of the post-maximum slope image is denoted as $S_{ms1}$.

$$MS(\%/min) = 100 \times \frac{S_{ms2} - S_{ms1}}{S_0(t_{ms2} - t_{ms1})} \qquad (10)$$

An area under the curve (AUC) is calculated in accordance with the following equation (11) on the basis of the sum of the signal values of the images after contrast agent injection (post-contrast agent injection images), the time difference between time $u_{N0+1}$ and time $u_N$, and the signal value $S_0$ of the non-contrast-enhanced image.

$$AUC(\% \text{ min}) = 100 \times \frac{1}{S_0} \sum_{i=N_0+1}^{N} \frac{u_{i+1} - u_{i-1}}{2} S(u_i) \qquad (11)$$

The above contrast enhancement parameters are mere examples, and contrast enhancement parameters are not limited thereto. The above equations of contrast enhancement parameters are those for one pixel, and contrast enhancement parameter values of a plurality of pixels are calculated by applying the same calculations to the pixels.

Next, the dependency of a signal value of an MR image on the contrast agent concentration, the contrast agent type, and the magnetic field strength will be described.

For dynamic-contrast-enhanced imaging, a field echo (FE) method is used. Since an MR contrast agent has the effect of decreasing the T1 value, the T1 value of a tissue decreases in response to injection of the contrast agent and, consequently, the MR signal strength of MR imaging increases. Therefore, time-series of MR images with signal value changes according to the contrast agent concentration are obtained.

The signal value of the MR signal of the FE method is expressed by equation (12). $T_R$ and $T_E$ are MR imaging parameters, and denote a repetition time and an echo time, respectively. $T_1$ and $T_2^*$ are parameters of tissues, and denote a longitudinal relaxation time and a transverse relaxation time, respectively.

$$S(u) = M_0 \sin \alpha \, \exp\left(\frac{-T_E}{T_2^*}\right) \frac{1 - \exp\left(\frac{-T_R}{T_1(u)}\right)}{1 - \exp\left(\frac{-T_R}{T_1(u)}\right) \cos \alpha} \qquad (12)$$

The term before the fraction in equation (12) can be regarded as a constant when a value sufficiently smaller than $T_2^*$ is used as the echo time $T_E$. In this case, the ratio of the current signal value to the signal value $S_0$ before contrast enhancement, i.e., the contrast enhancement differential signal ratio $S/S_0$, is expressed by equation (13). $R_1$ is $1/T_1(u)$, and $\Delta R_1$ is $R_1(u) - R_1(0)$. $R_1(0)$ is a reciprocal number of the $T_1$ value $T_1(0)$ before contrast enhancement. $\Delta R_1$ is known to be proportional to the contrast agent concentration of the tissue.

$$\frac{S}{S_0} = \frac{1 - \exp(-T_R(R_1 + \Delta R_1))}{1 - \exp(-T_R(R_1 + \Delta R_1)) \cos \alpha} \frac{1 - \exp(-T_R R_1) \cos \alpha}{1 - \exp(-T_R R_1)} \qquad (13)$$

It can be understood from equation (13) that the signal value or signal ratio changes in accordance with $\Delta R_1$, but the change is not linear. In the present embodiment, the signal value change is linearly approximated as shown in equations (14) and (15) for simplification.

$$S_0^{a,\#1} \approx m^{a,\#1} R_1^{a,\#1}(0) \qquad (14)$$

$$S^{a,\#1} \approx S_0^{a,\#1} + m^{a,\#1} c^{a,\#1} r_1^{a,\#1} = m^{a,\#1}(R_1^{a,\#1}(0) + c^{a,\#1} r_1^{a,\#1}) \qquad (15)$$

The linear approximation is an example, and is not an essential requirement. The upper right index a of each variable indicates that the variable is a value of tissue a. The upper right index #1 of each variable indicates that the variable is a value under imaging condition #1. For example, $S_0^{a,\#1}$ indicates a signal value of tissue a in a non-contrast-enhanced image acquired under imaging condition #1. In equation (15), the fact that the R1 value of tissue a after contrast enhancement is expressed as equation (16) using the contrast agent concentration $c^{a,\#1}$ and the contrast agent relaxivity $r_1^{\#1}$ is used.

$$\Delta R_1^{a,\#1}(u) = c^{a,\#1} r_1^{\#1} \qquad (16)$$

The increment $\Delta R_1^{a,\#1}(u)$ of the relaxivity of tissue a by the contrast agent under imaging condition #1 is expressed by a product of the contrast agent concentration $c^{a,\#1}$ of tissue a and the relaxivity $r_1^{\#1}$ of the contrast agent used for imaging condition #1. The unit of the concentration c is mmol/L, and the unit of the relaxivity $r_1$ is $S^{-1}(\text{mmol/L})^{-1}$. The contrast agent relaxivity $r_1$ is determined by the contrast agent type and the magnetic field strength.

When linearly approximated, the contrast enhancement differential ratio $e^{a,\#1}$ of tissue a under imaging condition #1 is expressed by equation (17) on the basis of the ratio between the signal value $S_0^{a,\#1}$ of tissue a in the non-contrast-enhanced image acquired under imaging condition #1 and the signal value $S^{a,\#1}$ of tissue a in an MR image acquired under imaging condition #1.

$$e^{a,\#1} = \frac{S^{a,\#1}}{S_0^{a,\#1}} - 1 \approx \frac{m^{a,\#1}(R_{10}^{a,\#1} + c^{a,\#1} r_1^{\#1})}{m^{a,\#1} R_{10}^{a,\#1}} - 1 = \frac{c^{a,\#1} r_1^{\#1}}{R_{10}^{a,\#1}} \qquad (17)$$

Accordingly, it can be understood that the contrast enhancement differential ratio $e^{a,\#1}$ can also be determined by the relaxivity $R_1^{a,\#1}(0)$ of tissue a before contrast enhancement, the contrast agent concentration (contrast agent injection amount), the contrast agent type, and the magnetic field strength. $R_1^{a,\#1}(0)$ is expressed as $R_{10}^{a,\#1}$.

Next, the relationship between contrast enhancement differential ratios of tissue a, tissue b, the standard imaging condition #1, and the examination-time imaging condition #2 as well as the calibration factor will be described.

The contrast enhancement differential ratio $e^{a,\#1}$ of imaging condition #1 and tissue a is expressed as equation (18) according to the above equation (17).

$$e^{a,\#1} = \frac{S^{a,\#1}}{S_0^{a,\#1}} - 1 \approx \frac{c^{a,\#1} r_1^{\#1}}{R_{10}^{a,\#1}} \qquad (18)$$

The contrast enhancement differential ratio $e^{a,\#1}$ of imaging condition #2 and tissue a is expressed as equations (19) to (22) in relation to the contrast enhancement differential ratio $e^{a,\#1}$.

$$e^{a,\#2} = \frac{S^{a,\#2}}{S_0^{a,\#2}} - 1 \approx \frac{c^{a,\#2} r_1^{\#2}}{R_{10}^{a,\#2}} = \frac{k_c^{\#2} c^{a,\#1} k_1^{\#2} r_1^{\#1}}{k_{10}^{a,\#2} R_{10}^{a,\#1}} = [k^{a,\#21}] e^{a,\#1} \qquad (19)$$

$$e^{a,\#1} = e^{a,\#2}/[k^{a,\#21}] \qquad (20)$$

$$[k^{a,\#21}] = \frac{k_c^{\#2} k_1^{\#2}}{k_{10}^{a,\#2}} \qquad (21)$$

$$c^{a,\#2} = k_c^{\#2} c^{a,\#1}$$

$$r_1^{\#2} = k_1^{\#2} r_1^{\#1}$$
$$R_{10}^{a,\#2} = k_{10}^{a,\#2} R_{10}^{a,\#1} \qquad (22)$$

Namely, the contrast enhancement differential ratio $e^{a,\#2}$ under the examination-time imaging condition #2 is a product of the contrast enhancement differential ratio $e^{a,\#1}$ under the standard imaging condition #1 and a calibration factor $[k^{a,\#21}]$. To convert the contrast enhancement differential ratio $e^{a,\#2}$ under imaging condition #2 to that under the standard imaging condition #1, the contrast enhancement differential ratio $e^{a,\#2}$ under imaging condition #2 only has to be divided by the calibration factor $[k^{a,\#21}]$ Note that the calibration factor $[k^{a,\#21}]$ is determined based on the contrast agent concentration ratio $k_C^{\#2}$, contrast agent relaxivity ratio $k_1^{\#2}$, and tissue relaxivity ratio $k_{10}^{a,\#2}$ between the standard imaging condition #1 and the examination-time imaging condition #2. The contrast agent relaxivity ratio $k_1^{\#2}$ is determined based on the contrast agent type and the magnetic field strength. The tissue relaxivity is determined based on the properties of the tissue and the magnetic field strength.

Like the contrast enhancement differential ratio $e^{a,\#1}$, the contrast enhancement differential ratio $e^{b,\#1}$ of the standard imaging condition #1 and tissue b is expressed as equation (23).

$$e^{b,\#1} = \frac{S^{b,\#1}}{S_0^{b,\#1}} - 1 \approx \frac{c^{b,\#1} r_1^{\#1}}{R_{10}^{b,\#1}} \qquad (23)$$

Like the contrast enhancement differential ratio $e^{a,\#2}$, the contrast enhancement differential ratio $e^{b,\#2}$ of the examination-time imaging condition #2 and tissue b is expressed as equations (24) to (26).

$$e^{b,\#2} = \frac{S^{b,\#2}}{S_0^{b,\#2}} - 1 \approx \frac{c^{b,\#2} r_1^{\#2}}{R_{10}^{b,\#2}} = \frac{k_c^{\#2} c^{b,\#1} k_1^{\#2} r_1^{\#1}}{k_{10}^{b,\#2} R_{10}^{b,\#1}} = [k^{b,\#21}] e^{b,\#1} \qquad (24)$$

$$e^{b,\#1} = \frac{1}{[k^{b,\#21}]} e^{b,\#2} \qquad (25)$$

$$[k^{b,\#21}] = \frac{k_c^{\#2} k_1^{\#2}}{k_{10}^{b,\#2}} = \frac{k_c^{\#2} k_1^{\#2} / k_{10}^{b,\#2}}{k_c^{\#2} k_1^{\#2} / k_{10}^{a,\#2}} [k^{a,\#21}] = [k^{a,\#21}] / \frac{k_{10}^{b,\#2}}{k_{10}^{a,\#2}} \qquad (26)$$

To convert the contrast enhancement differential ratio $e^{b,\#2}$ under the examination-time imaging condition #2 to the contrast enhancement differential ratio $e^{b,\#1}$ under the standard imaging condition #1, the contrast enhancement differential ratio $e^{b,\#2}$ only has to be divided by a calibration factor $[k^{b,\#21}]$. $[k^{b,\#21}]$ is a value obtained by multiplying $[k^{a,\#2}]$ by $k_{10}^{b,\#2}/k_{10}^{a,\#2}$. $k_{10}^{b,\#2}$ is a value obtained by dividing the relaxivity ratio $k_{10}^{b,\#2}$ of tissue b between the standard imaging condition #1 and the examination-time imaging condition #2 by the relaxivity ratio $k_{10}^{a,\#2}$ of tissue a between the standard imaging condition #1 and the examination-time imaging condition #2. The calibration factor $[k^{b,\#21}]$ is determined based on the contrast agent concentration ratio $k_C^{\#2}$ between the standard imaging condition #1 and the examination-time imaging condition #2 as well as the ratio $k_1^{\#2}$ of the contrast agent relaxivity, which is determined by the contrast agent type and the magnetic field strength, between the imaging conditions and the relaxivity ratio $k_{10}^{b,\#2}$ of tissue b between the imaging conditions.

An object of the present embodiment is to provide contrast enhancement parameter values in which changes in the contrast agent concentration, contrast agent relaxivity, and tissue relaxivity depending on differences in imaging condition have less influence, and to enable correct measurement of the ratio of the signal value of a tissue to the signal value before contrast enhancement. It is therefore required to calibrate contrast enhancement parameter values on the basis of, not only the concentration and injection amount of the contrast agent, but also information on the magnetic field strength of each of the standard imaging condition and examination-time imaging condition in consideration of changes in the tissue relaxivity. Namely, to correctly compensate for the differences in imaging condition, it is necessary to take into account (1) the difference in contrast enhancement signal value change depending on the difference in contrast agent injection amount and difference in contrast agent relaxivity according to the magnetic field strength and the contrast agent type, and (2) the difference in signal value of tissue depending on the magnetic field strength.

As described above, according to the present embodiment, a calibration factor for converting various types of information (such as a signal value of an MR image, a signal value of a contrast-enhanced image, and a contrast enhancement parameter value) acquired under the examination-time imaging condition to various types of information acquired under the standard imaging condition is calculated on the basis of the examination-time imaging condition and the standard imaging condition. The imaging condition includes magnetic field information, contrast agent information, and/or tissue information. Calibration of various types of information using the calibration factor enables calibration of contrast enhancement parameter values in consideration of the changes in the tissue relaxivity based on not only the concentration and injection amount of the contrast agent, but also information on the magnetic field strength of each of the standard imaging condition and examination-time imaging condition.

As can be seen from equations (24) to (26), application of the calibration factor to various types information under the examination-time imaging condition makes the contrast enhancement differential ratio after calibration ((post-contrast enhancement signal value–pre-contrast enhancement signal value)/pre-contrast enhancement signal value) smaller than the contrast enhancement differential ratio before calibration when the contrast agent relaxivity and contrast agent injection amount or reciprocal number (tissue relaxation time) of the tissue relaxivity are larger under the examination-time imaging condition than under the standard imaging condition. Application of the calibration factor also makes it possible to keep the contrast enhancement differential ratio zero when there is no change in the signal value caused by the contrast agent. Namely, use of the calibration factor enables conversion of the absolute value of a signal value to a value under the standard imaging condition while maintaining the relative relationship between the post-contrast enhancement signal value and pre-contrast enhancement signal value under the examination-time imaging condition. This provides a prominent effect in comparison with the method of scaling signal values acquired under the examination-time imaging condition.

FIG. 2 is a diagram showing a typical flow of analysis processing of time-series of MR images by the medical image processing apparatus 1. The time-series of MR images mean a series of MR images of multiple time-points generated by performing MR imaging on a subject in which a contrast agent has been injected. The time-series of MR images are also referred to as an MR dynamic image. The body part examined according to the present embodiment may be any site for which contrast enhancement using an MR contrast agent is used. Examples of the body part examined according to the present embodiment may include a head, chest, and abdomen, and organs such as a heart, lung, liver, kidney, and spleen. The subject is not limited to a human, and may be dead or alive.

In the analysis processing, the processing circuitry 11 first implements the obtaining function ill, thereby obtaining first multiple-time-points MR images (step S1). The first multiple-time points MR images are generated by the magnetic resonance imaging apparatus performing MR imaging on a subject in which a contrast agent has been injected, in accordance with an examination-time imaging condition.

In the contrast-enhanced MR examination, an MR dynamic image is acquired using various imaging sequences. For head-contrast-enhanced dynamic imaging for example, an FE method may be used to acquire dynamic contrast-enhanced T1 weighted images in time series. Since an MR contrast agent has the effect of decreasing the T1 value, the T1 value of a tissue decreases in response to injection of the contrast agent and, consequently, the MR signal strength of MR imaging increases. Therefore, a dynamic image with a signal value change according to the contrast agent concentration is acquired. In head dynamic susceptibility contrast (DSC) MR imaging, echo planar imaging (EPI) is used, and T2*-enhanced images are acquired in time series. Since an MR contrast agent has the effect of decreasing the T2* value, the contrast agent concentration of a tissue in the body of the subject decreases in response to injection of the contrast agent. As a result, the T2* value of the tissue decreases, the MR signal strength attenuates, and time-series T2* images with a signal value change according to the contrast agent concentration of the tissue are acquired.

Through implementation of the setting function 112, the processing circuitry 11 sets an examination-time imaging condition and a standard imaging condition (step S2). After step S2, the processing circuitry 11 calculates, through implementation of the index value calculation function 113, a calibration factor on the basis of the examination-time imaging condition and the standard imaging condition (step S3).

The examination-time imaging condition is an imaging condition relating to first dynamic MR images obtained in step S1. If a contrast-enhanced MR examination has already been conducted, then the examination-time imaging condition has already been set in the magnetic resonance imaging apparatus and associated with the first dynamic MR images obtained in step S1. This means that the examination-time imaging condition is set in step S2 in the analysis processing by the processing circuitry 11 which is shown in FIG. 2.

The standard imaging condition is a virtual imaging condition set for evaluating contrast enhancement parameter values under a certain condition regardless of the values of the examination-time imaging condition. The examination-time imaging condition and the standard imaging condition are set to determine a calibration factor. Various types of information are used for determination of a calibration factor. Examples of the method for determining a calibration factor include a method of determining a calibration factor using tissue information relating to an object tissue (calibration factor determination example 1) and a method of determining a calibration factor with tissue information using an object tissue and a reference tissue (calibration factor determination example 2).

The calibration factor determined by the calibration factor determination example 1 is calculated based on the contrast agent concentration ratio, contrast agent relaxivity ratio, and tissue relaxivity ratio. The contrast agent concentration ratio is a ratio between the contrast agent injection amount of the contrast agent information relating to the examination-time imaging condition and the contrast agent injection amount of the contrast agent information relating to the standard imaging condition. The contrast agent relaxivity ratio is a ratio between the contrast agent relaxivity of the contrast agent information relating to the examination-time imaging condition and the contrast agent relaxivity of the contrast agent information relating to the standard imaging condition. The tissue relaxivity ratio is a ratio between the tissue relaxivity of the tissue information relating to the examination-time imaging condition and the tissue relaxivity of the tissue information relating to the standard imaging condition, and is determined by the static magnetic field strength (magnetic field information) of each of the standard imaging condition and the examination-time imaging condition.

The calibration factor determined by the calibration factor determination example 2 is calculated based on the contrast enhancement differential ratio of the reference tissue of the tissue information relating to the standard imaging condition, the contrast enhancement differential ratio of the reference tissue of the tissue information relating to the examination-time imaging condition, the tissue relaxivity ratio of the reference tissue, and the tissue relaxivity ratio of the object tissue. The tissue relaxivity ratio of the reference tissue is a ratio between the tissue relaxivity of the reference tissue of the tissue information relating to the examination-time imaging condition and the tissue relaxivity of the reference tissue of the tissue information relating to the standard imaging condition. The tissue relaxivity ratio of the object tissue is a ratio between the tissue relaxivity of the object tissue of the tissue information relating to the examination-time imaging condition and the tissue relaxivity of the object tissue of the tissue information relating to the standard imaging condition, and is determined by the static magnetic field strength (magnetic field information) of each of the standard imaging condition and the examination-time imaging condition. In addition, the contrast enhancement differential ratio of the reference tissue of the tissue information relating to the standard imaging condition and the contrast enhancement differential ratio of the reference tissue of the tissue information relating to the examination-time imaging condition are information on tissue as well as contrast agent information including the contrast agent type and the contrast agent injection amount.

The examination-time imaging condition and the standard imaging condition are set through, for example, an imaging condition input window. The imaging condition input window varies between calibration factor determination examples. Through implementation of the display control function 115, the processing circuitry 11 causes the display 13 to display an input window for inputting values of the examination-time imaging condition and the standard imaging condition. Through implementation of the setting function 112, the processing circuitry 11 sets the examination-time imaging condition and/or the standard imaging condition in according to the values input to the input window.

FIG. 3 is a diagram showing an example of an imaging condition input window I1 according to calibration factor determination example 1. As shown in FIG. 3, the input window I1 includes a field I11 of a standard imaging condition, a field I12 of an examination-time imaging condition, and a display field I13 of a calibration factor. The input window I1 is displayed on the display 13 by the processing circuitry 11.

As shown in FIG. 3, the field I11 of the standard imaging condition includes, for example, a field I111 of contrast agent injection amount, a field I112 of contrast agent type, a field I113 of magnetic field strength, a field I114 of contrast agent relaxivity, and a field I115 of tissue relaxivity. The standard imaging condition is stored in the memory circuitry 15, and is read from the memory circuitry 15 and set by the processing circuitry 11. The standard imaging condition consists of fixed values, and is automatically input to and shown in the field I11, and a change of the values by the user is restricted in daily use. For example, the contrast agent injection amount is set to 0.1 mmol/kg, and the magnetic field strength is set to 1.5 T. As the contrast agent relaxivity, a specified value (or measured value) of the relaxivity r1 in blood is preset. No specific value may be displayed as the tissue relaxivity $R_{10}$. The contrast agent concentration in the object tissue is considered to be approximately proportional to the contrast agent injection amount per kilogram of body weight [mmol/kg], i.e., contrast agent concentration [mol/L]×contrast agent injection amount [mL]/weight [kg]. The value of the standard imaging condition may be manually input by the user through the input interface 14.

As shown in FIG. 3, the field I12 of the examination-time imaging condition includes, for example, a field I121 of object tissue type, a field I122 of contrast agent injection amount, a field I123 of contrast agent type, a field I124 of magnetic field strength, a field I125 of contrast agent relaxivity, and a field I126 of tissue relaxivity.

In the field I121 of object tissue type, a value selected from a plurality of predetermined tissues, such as XX nodule, XX enlargement, XX tumor, XX node, and XX swelling, is input. Specifically, a value is selected from alternatives such as lung nodule, brain tumor, and cervical lymph node.

In the field I122 of contrast agent injection amount of the examination-time imaging condition, a numerical value is input. In the field I123 of contrast agent type, a value selected from a plurality of predetermined contrast agent types, such as contrast agent A, contrast agent B, and contrast agent C is input.

The contrast agent concentration ratio $k_c^{\#2}$ is calculated in accordance with equation (27) on the basis of the contrast agent injection amount of the examination-time imaging condition and the contrast agent inject ion amount of the standard imaging condition. Herein, the contrast agent concentration of a tissue is assumed to be proportional to the contrast agent injection amount. As shown in equation (27), the contrast agent concentration ratio $k_c^{\#2}$ is a ratio between the contrast agent injection amount $c^{\#2}$ of the examination-time imaging condition and the contrast agent injection amount $c^{\#1}$ of the standard imaging condition.

$$k_c^{\#2} = \frac{c^{b,\#2}}{c^{b,\#1}} = \frac{c^{\#2}}{c^{\#1}} \tag{27}$$

In the field I124 of magnetic field strength of the examination-time imaging condition, a value selected from a plurality of predetermined magnetic field strengths is input. For example, a value is selected from alternatives such as 0.5 T, 1.5 T, 2 T, and 3 T.

In the field I125 of contrast agent relaxivity of the examination-time imaging condition, a numerical value corresponding to the contrast agent relaxivity is automatically input. The operator need not input the value. For example, a look-up table (LUT) in which the correspondence between a relaxivity value and a combination of a contrast agent type and a magnetic field strength is registered is created and stored in the memory circuitry 15 in advance. The processing circuitry 11 applies the LUT to a set combination of a contrast agent type and a magnetic field strength and automatically sets a contrast agent relaxivity. The control circuitry 11 then calculates a contrast agent relaxivity ratio $k_1^{\#2}$ in accordance with equation (28) on the basis of the contrast agent relaxivity of the examination-time imaging condition and the contrast agent relaxivity of the standard imaging condition. As shown in equation (28), the contrast agent relaxivity $k_1^{\#2}$ is a ratio between the contrast agent relaxivity $r_1^{\#2}$ of the examination-time imaging condition and the contrast agent relaxivity $r_1^{\#1}$ of the standard imaging condition.

$$k_1^{\#2} = \frac{r_1^{\#2}}{r_1^{\#1}} \tag{28}$$

In the field I126 of tissue relaxivity of the examination-time imaging condition, a numerical value corresponding to the tissue relaxivity is automatically input. The operator need not input the value. Specifically, a numerical value indicating a ratio (tissue relaxivity ratio) corresponding to the tissue relaxivity of the standard imaging condition is shown in the field I126 of tissue relaxivity. For example, in the field I126 of FIG. 3, a tissue relaxivity of the examination-time imaging condition is shown as a ratio corresponding to the tissue relaxivity ratio "a" of the standard imaging condition.

When the tissue relaxivity $R_{10}^{b,\#2}$ of the examination-time imaging condition and the tissue relaxivity $R_{10}^{b,\#1}$ of the standard imaging condition are set, the tissue relaxivity ratio $k_{10}^{b,\#2}$ is calculated in accordance with equation (29) on the basis of the tissue relaxivity $R_{10}^{b,\#1}$ and the tissue relaxivity $R_{10}^{b,\#2}$. As shown in equation (29), the tissue relaxivity ratio $k_{10}^{b,\#2}$ is a ratio between the tissue relaxivity $R_{10}^{b,\#2}$ of the standard imaging condition and the tissue relaxivity $R_{10}^{b,\#2}$ of the examination-time imaging condition.

$$k_{10}^{b,\#2} = \frac{R_{10}^{b,\#2}}{R_{10}^{b,\#1}} \tag{29}$$

The tissue relaxivity $R_{10}^{b,\#1}$ is set based on a combination of an object tissue type, a magnetic field strength of the standard imaging condition, and a magnetic field strength of the examination-time imaging condition. For example, an LUT in which the correspondence between a tissue relaxivity $R_{10}^{b,\#1}$ and a combination of an object tissue type, a magnetic field strength of the standard imaging condition, and a magnetic field strength of the examination-time imaging condition is registered is created and stored in the memory circuitry 15 in advance. The processing circuitry 11 applies the LUT to a set combination of an object tissue type, a magnetic field strength of the standard imaging condition, and a magnetic field strength of the examination-time imaging condition, and determines the tissue relaxivity $R_{10}^{b,\#1}$.

When the tissue relaxivity ratio $k_{10}^{b,\#2}$, the contrast agent concentration ratio $k_c^{\#2}$, and the contrast agent relaxivity ratio $k_1^{\#2}$ are calculated, the processing circuitry 11 calculates a calibration factor $[k^{b,\#21}]$ in accordance with equation (30) on the basis of the tissue relaxivity ratio $k_{10}^{b,\#2}$, the contrast agent concentration ratio $k_c^{\#2}$, and the contrast agent relaxivity ratio $k_1^{\#2}$. The calculated calibration factor $[k^{b,\#21}]$ is shown in the display field I13 in FIG. 3.

$$[k^{b,\#21}] = \frac{k_c^{\#2} k_1^{\#2}}{k_{10}^{b,\#2}} \quad (30)$$

The object tissue type, contrast agent injection amount, and magnetic field strength under the examination-time imaging condition are associated with the multiple-time MR images as header information or DICOM tag information. Accordingly, the processing circuitry 11 may automatically set the object tissue type, contrast agent injection amount, and magnetic field strength under the examination-time imaging condition by obtaining them from the header information or DICOM tag information of the multiple-time MR images.

As described above, the input window I1 in FIG. 3 includes setting items such as the contrast agent injection amount ratio, the contrast agent type, and the magnetic field strength. By means of the input window I1, the contrast agent concentration ratio, contrast agent relaxivity ratio, and tissue relaxivity ratio can be calculated on the basis of the contrast agent injection amount ratio, contrast agent type, and magnetic field strength, and a calibration factor can be calculated on the basis of the contrast agent concentration ratio, contrast agent relaxivity ratio, and tissue relaxivity ratio.

Figure 4:
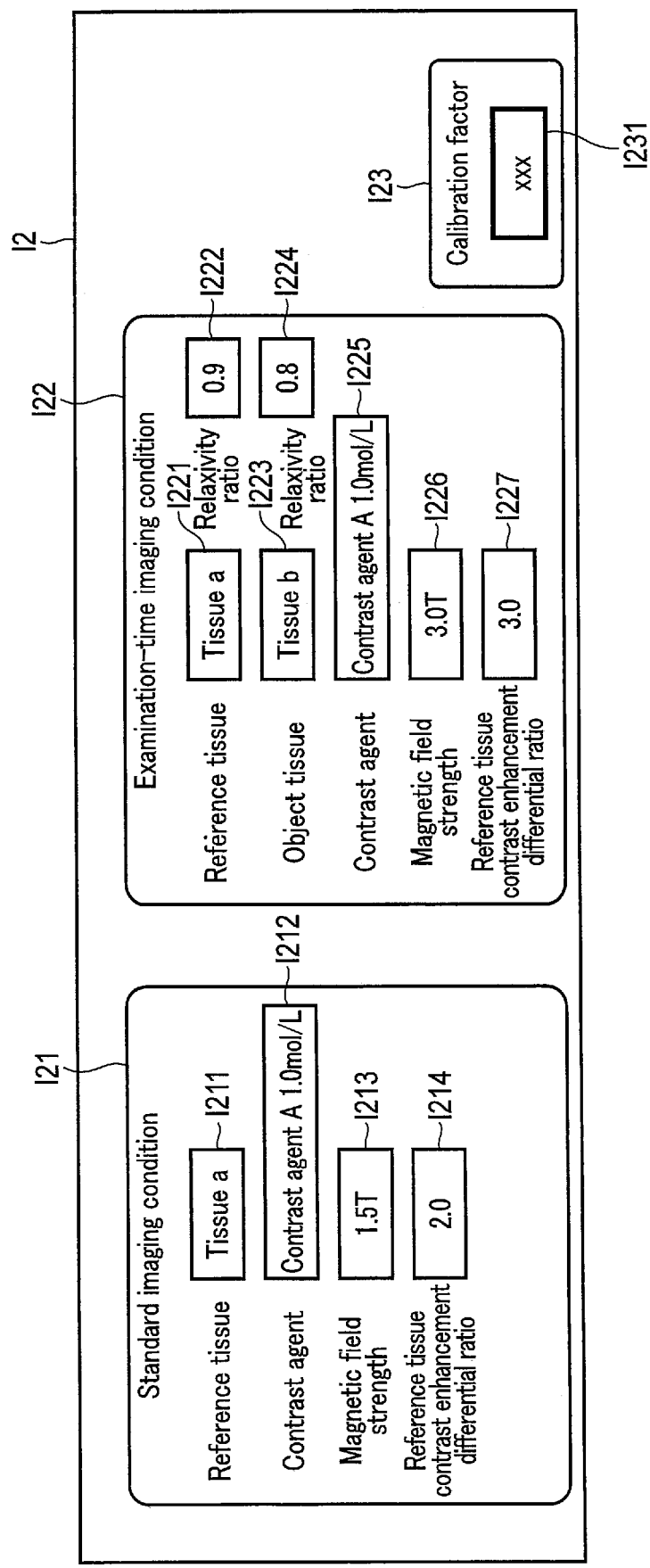
FIG. 4 is a diagram showing an example of an imaging condition input window according to calibration factor determination example 2.

FIG. 4 is a diagram showing an example of an imaging condition input window I2 according to calibration factor determination example 2. As shown in FIG. 4, the input window I2 includes a field I21 of standard imaging condition, a field I22 of examination-time imaging condition, and a display field I23 of calibration factor. The input window I2 is displayed on the display 13 by the processing circuitry 11.

As shown in FIG. 4, the field I21 of standard imaging condition includes a field I211 of reference tissue, a field I212 of contrast agent type, a field I213 of magnetic field strength, and a field I214 of contrast enhancement differential ratio of reference tissue. In the field I211 of reference tissue, a value selected from a plurality of predetermined tissues, such as XX muscle, XX bone, and XX vein, is input. As the reference tissue, a tissue exhibiting a stable contrast enhancement effect in the vicinity of the measurement object tissue and having little possibility of including a lesion is selected. In the field I211 of reference tissue, a tissue discretionarily selected by the user may be input.

The field I212 of contrast agent type and field I213 of magnetic field strength are the same as the field I112 of contrast agent type and field I113 of magnetic field strength in FIG. 3.

In the field I214 of reference tissue contrast enhancement differential ratio, a numerical value of the contrast enhancement differential ratio of the reference tissue under the standard imaging condition is input. The contrast enhancement differential ratio $E^{a,\#1}$ of reference tissue a under the standard imaging condition is calculated in accordance with equation (31) on the basis of the signal value $S_0^{a,\#1}$ of the reference tissue a in the non-contrast-enhanced image acquired under the standard imaging condition.

$$E^{a,\#1} = \frac{S^{a,\#1} - S_0^{a,\#1}}{S_0^{a,\#1}} \quad (31)$$

The value of the contrast enhancement differential ratio $E^{a,\#1}$ of the reference tissue a is a value corresponding to the reference tissue, contrast agent type, and magnetic field strength selected in the field I21 of standard imaging condition. As the contrast enhancement differential ratio of the reference tissue a, a value measured in the relevant facility or a standard value may be set.

The case where the contrast enhancement differential ratio $E^{a,\#1}$ of the reference tissue a is measured will be described. First, a contrast-enhanced examination is conducted on a plurality of patients under the standard imaging condition #1, and the signal value $S_0$ of the non-contrast-enhanced image and the signal value $S_1$ of the initial contrast-enhanced image of the reference tissue a are measured. The processing circuitry 11 determines the contrast enhancement differential ratio of the reference tissue a on the basis of the signal value $S_0$ of the non-contrast-enhanced image and the signal value $S_1$ of the initial contrast-enhanced image of the reference tissue a. For example, the processing circuitry 11 generates a scatter diagram as shown in FIG. 5 on the basis of the signal value $S_0$ of the non-contrast-enhanced image and the signal value $S_1$ of the initial contrast-enhanced image of the reference tissue a. The ordinate of the scatter diagram represents the signal value $S_1$, and the abscissa thereof represents the signal value $S_0$. The processing circuitry 11 plots a point 21 corresponding to a combination of a signal value $S_0$ and a signal value $S_1$ for each patient, and calculates a regression line 23 based on a plurality of points 21. The slope of the regression line equals the contrast enhancement differential ratio of the reference tissue a.

The field I22 of examination-time imaging condition includes a field I221 of reference tissue type, a field I222 of reference tissue relaxivity ratio, a field I223 of object tissue type, a field I224 of object tissue relaxivity ratio, a field I225 of contrast agent type, a field I226 of magnetic field strength, and a field I227 of reference tissue contrast enhancement differential ratio.

The field I221 of reference tissue type shows a name of a reference tissue, the field I222 of reference tissue relaxivity ratio shows a relaxivity ratio of a reference tissue, the field I223 of object tissue type shows a name of an object tissue, the field I224 of object tissue relaxivity ratio shows a relaxivity ratio of an object tissue, the field I225 of contrast agent type shows a name and concentration of a contrast agent, the field I226 of magnetic field strength shows a magnetic field strength, and the field I227 of reference tissue contrast enhancement differential ratio shows a contrast enhancement differential ratio of a reference tissue.

The reference tissue relaxivity ratio $k_{10}^{a,\#2}$ is defined by equation (32) on the basis of the tissue relaxivity $R_{10}^{a,\#1}$ and the tissue relaxivity $R_{10}^{a,\#2}$. Therefore, the operator need not input the value.

$$k_{10}^{a,\#2} = \frac{R_{10}^{a,\#2}}{R_{10}^{a,\#1}} \quad (32)$$

The object tissue relaxivity ratio $k_{10}^{b,\#2}$ is defined by equation (33) on the basis of the tissue relaxivity $R_{10}^{b,\#1}$ and the tissue relaxivity $R_{10}^{b,\#2}$. Therefore, the operator need not input the value.

$$k_{10}^{b,\#2} = \frac{R_{10}^{b,\#2}}{R_{10}^{b,\#1}} \quad (33)$$

The contrast enhancement differential ratio $E^{a,\#2}$ of the reference tissue a under the examination-time imaging condition is calculated in accordance with equation (34). At this time, a region of interest should be set in the reference tissue included in each contrast-enhanced image, and the reference tissue contrast enhancement differential ratio $E^{a,\#2}$ should be calculated and set on the basis of the signal values of pixels in the set region of interest.

$$E^{a,\#2} = \frac{S^{a,\#2} - S_0^{a,\#2}}{S_0^{a,\#2}} \quad (34)$$

As the value of the contrast enhancement differential ratio $E^{a,\#2}$, a value measured in the relevant facility or a standard value may be set. Like the contrast enhancement differential ratio $E^{a,\#1}$, the contrast enhancement differential ratio $E^{a,\#2}$ may be measured by calculation using a scatter diagram.

The calibration factor $[k^{b,\#21}]$ is calculated in accordance with equation (35) on the basis of the reference tissue relaxivity ratio $k_{10}^{a,\#2}$, the tissue relaxivity ratio $k_{10}^{b,\#2}$, the contrast enhancement differential ratio $E^{a,\#2}$, and the contrast enhancement differential ratio $E^{a,\#1}$.

$$[k^{b,\#21}] \approx \frac{(S^{a,\#2} - S_0^{a,\#2})/S_0^{a,\#2}}{(S^{a,\#1} - /S_0^{\#1})/S_0^{\#1}} \frac{R_{10}^{a,\#2}}{R_{10}^{a,\#1}} \frac{R_{10}^{b,\#1}}{R_{10}^{b,\#2}} \quad (35)$$

$$= \frac{E^{a,\#2}}{E^{a,\#1}} \frac{k_{10}^{a,\#2}}{k_{10}^{b,\#2}}$$

The calculated calibration factor $[k^{b,\#21}]$ is shown in the display field I23 in FIG. 4.

The contrast agent types of the standard imaging condition and the examination-time imaging condition are input and shown in the fields only for confirmation of the imaging conditions, and are not used for calculation of the calibration factor.

As described above, the input window I2 includes setting items of the contrast enhancement differential ratio and the magnetic field strength. By means of the input window I2, the product $k_c^{\#2} k_1^{\#2}$ of the contrast agent concentration ratio $k_c^{\#2}$ and the contrast agent relaxivity ratio $k_1^{\#2}$ is calculated in accordance with equation (36) on the basis of the contrast agent signal ratio and the magnetic field strength. Equation (36) is derived from equations (35) and (30) both of which express the same calibration factor.

$$k_c^{\#2} k_1^{\#2} = \frac{E^{a,\#2}}{E^{a,\#1}} k_{10}^{a,\#2} \quad (36)$$

It is also possible to calculate the tissue relaxivity ratio $k_{10}^{b,\#2}$, and then calculate the calibration factor $[k^{b,\#21}]$ in accordance with equation (30) on the basis of the tissue relaxivity ratio $k_{10}^{b,\#2}$ and the product $k_c^{\#2} k_1^{\#2}$. The calculated calibration factor $[k^{b,\#21}]$ is shown in the display field I23 in FIG. 4.

After steps S1 and S3, the processing circuitry 11 calculates, through implementation of the index value calculation function 113, a calibrated contrast enhancement parameter value on the basis of the first dynamic MR images and the calibration factor (step S4). In step S4, the processing circuitry 11 calculates calibrated contrast enhancement parameter values for a plurality of pixels, thereby generating a calibrated contrast enhancement parametric map, which shows spatial distribution of the calibrated contrast enhancement parameter values. As the contrast enhancement parameter for which the calibrated contrast enhancement parameter value is calculated, a contrast enhancement parameter is discretionarily selected from the IE, PPE, PIE, SER, MS, and AUC. A color value corresponding to the contrast enhancement parameter value is assigned to each pixel of the contrast enhancement parametric map.

Hereinafter, a specific example of the method for generating the calibrated contrast enhancement parametric map will be described with IE and PIE taken as examples of the contrast enhancement parameter. There are two methods for generating the calibrated contrast enhancement parametric map: a method of calibrating an uncalibrated contrast enhancement parametric map on the basis of a calibration factor (hereinafter referred to as a "first calibration method"), and a method of calibrating contrast-enhanced images on the basis of a calibration factor and generating a calibrated contrast enhancement parametric map based on the calibrated contrast-enhanced images (hereinafter referred to as a "second calibration method").

Hereinafter, the first calibration method will be described. Here, the contrast enhancement parameters acquired under the examination-time imaging condition are denoted as, for example, $IE^{\#2}$, $PPE^{\#2}$, $PIE^{\#2}$, $SER^{\#2}$, $MS^{\#2}$, and $AUC^{\#2}$ with accompanying symbol #2, which indicates the examination-time imaging condition. The calibrated contrast enhancement parameters are denoted as, for example, $IE^{\#1}$, $PPE^{\#1}$, $PIE^{\#1}$, $SER^{\#1}$, $MS^{\#1}$, and $AUC^{\#1}$ with accompanying symbol #1, which indicates the standard imaging condition.

The calibrated contrast enhancement parameter value $IE^{\#1}$ is calculated in accordance with equation (37) on the basis of the calibration factor $k^{b,\#21}$ and the contrast enhancement parameter value $IE^{\#2}$ under the examination-time imaging condition.

$$IE^{\#1} = e^{\#1}(t_1) = \frac{1}{k^{b,\#21}} e^{\#2}(t_1) = \frac{1}{k^{b,\#21}} IE^{\#2} \quad (37)$$

The calibrated contrast enhancement parameter value $PPE^{\#1}$ is calculated in accordance with equation (38) on the basis of the calibration factor $k^{b,\#21}$ and the contrast enhancement parameter value $PPE^{\#2}$ under the examination-time imaging condition.

$$PPE^{\#1} = e^{\#1}(t_{peak}) = \frac{1}{k^{b,\#21}} e^{\#2}(t_{peak}) = \frac{1}{k^{b,\#21}} PPE^{\#2} \quad (38)$$

The calibrated contrast enhancement parameter value $MS^{\#1}$ is calculated in accordance with equation (39) on the basis of the calibration factor $k^{b,\#21}$ and the contrast enhancement parameter value $MS^{\#2}$ under the examination-time imaging condition.

$$MS^{\#1} = \frac{S^{\#1}(t_{ms2}) - S^{\#1}(t_{ms1})}{S_0^{\#1} \times (t_{ms2} - t_{ms1})} = \quad (39)$$

$$= \frac{1}{t_{ms2} - t_{ms1}} \left( \frac{S^{\#1}(t_{ms2}) - S_0^{\#1}}{S_0^{\#1}} - \frac{S^{\#1}(t_{ms1}) - S_0^{\#1}}{S_0^{\#1}} \right)$$

$$= \frac{1}{t_{ms2} - t_{ms1}} (e^{\#1}(t_{ms2}) - e^{\#1}(t_{ms1})) =$$

$$= \frac{1}{t_{ms2} - t_{ms1}} \frac{1}{k^{b,\#21}} (e^{\#2}(t_{ms2}) - e^{\#2}(t_{ms1}))$$

$$= \frac{1}{k^{b,\#21}} MS^{\#2}$$

The calibrated contrast enhancement parameter value $PIE^{\#1}$ is calculated in accordance with equation (40) on the basis of the calibration factor $k^{b,\#21}$ and the contrast enhancement parameter value $PIE^{\#2}$ under the examination-time imaging condition.

$$PIE^{\#1} = \frac{S^{\#1}(t_{last}) - S^{\#1}(t_1)}{S^{\#1}(t_1)} = \qquad (40)$$

$$\frac{S_0^{\#1}}{S^{\#1}(t_1)}\left(\frac{S^{\#1}(t_{last}) - S_0^{\#1}}{S_0^{\#1}} - \frac{S^{\#1}(t_1) - S_0^{\#1}}{S_0^{\#1}}\right) =$$

$$\frac{1}{1 + e^{\#1}(t_1)}\left(e^{\#1}(t_{last}) - e^{\#1}(t_1)\right)$$

$$= \frac{1}{1 + \frac{1}{k^{b,\#21}}e^{\#2}(t_1)} \frac{1}{k^{\#21}}\left(e^{\#2}(t_2) - e^{\#2}(t_1)\right) =$$

$$\frac{1 + e^{\#2}(t_1)}{k^{b,\#21} + e^{\#2}(t_1)} \frac{1}{1 + e^{\#2}(t_1)}\left(e^{\#2}(t_2) - e^{\#2}(t_1)\right) =$$

$$\frac{1 + e^{\#2}(t_1)}{k^{b,\#21} + e^{\#2}(t_1)} PIE^{\#2}$$

$$= \frac{1 + IE^{\#2}}{k^{\#21} + IE^{\#2}} PIE^{\#2}$$

The calibrated contrast enhancement parameter value $SER^{\#1}$ is calculated in accordance with equation (41) on the basis of the calibration factor $k^{b,\#21}$ and the contrast enhancement parameter value $SER^{\#2}$ under the examination-time imaging condition.

$$SER^{\#1} = \frac{S^{\#1}(t_1) - S^{\#1}(t_0)}{S^{\#1}(t_2) - S^{\#1}(t_0)} = \qquad (41)$$

$$\frac{S^{\#}(t_1) - S^{\#1}(t_0)}{S_0^{\#1}} \frac{S_0^{\#1}}{S^{\#}(t_2) - S^{\#1}(t_0)} = \frac{e^{\#1}(t_1)}{e^{\#1}(t_2)} = \frac{e^{\#2}(t_1)}{k^{b,\#21}} \frac{k^{\#21}}{e^{\#2}(t_2)} = SER^{\#2}$$

Figure 6:
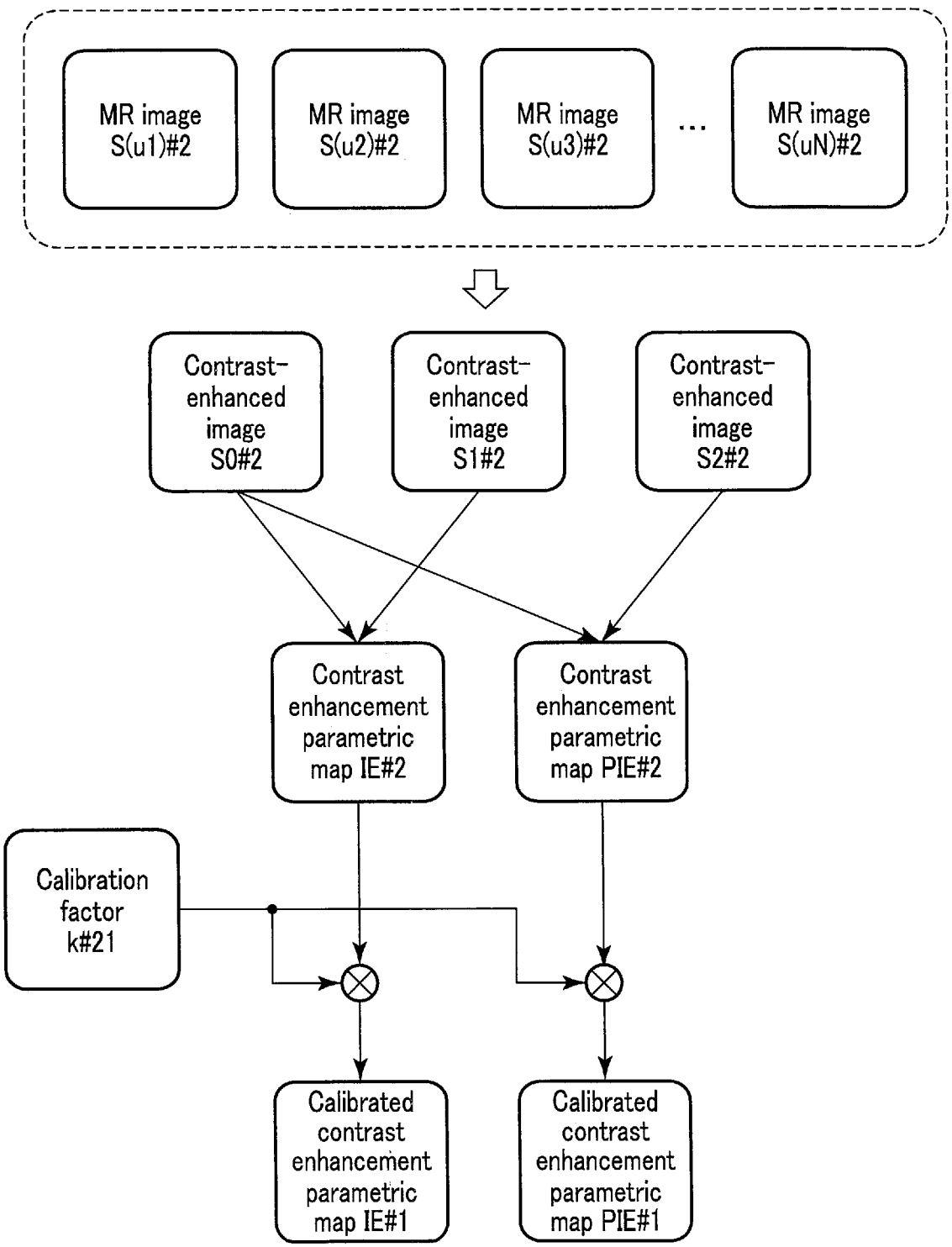
FIG. 6 is a diagram schematically showing a process of a first calibration method of a calibrated contrast enhancement parametric map.

FIG. 6 is a diagram schematically showing a process of the first calibration method of a calibrated contrast enhancement parametric map. In FIG. 6, the contrast enhancement parameter values are assumed to be IE and PIE. As shown in FIG. 6, first dynamic MR images $S(u1), \ldots,$ and $S(uN)$ of multiple times $u1, \ldots,$ and $uN$ generated under the examination-time imaging condition #2 are obtained. Based on the MR images $S(u1), \ldots$ and $S(uN)$ of multiple times $u1, \ldots,$ and $uN$, a non-contrast-enhanced image $S_0^{\#2}$ is generated in accordance with equation (1), an initial contrast-enhanced image $S_1^{\#2}$ is generated in accordance with equation (2), and a post-initial contrast-enhanced image $S_2^{\#2}$ is generated in accordance with equation (3). A contrast enhancement parametric map $IE^{\#2}$ relating to the contrast enhancement parameter IE is generated in accordance with equation (6) on the basis of the non-contrast-enhanced image $S_0^{\#2}$ and the initial contrast-enhanced image $S_1^{\#2}$, and a contrast enhancement parametric map $PIE^{\#2}$ relating to the contrast enhancement parameter PIE is generated in accordance with equation (7) on the basis of the non-contrast-enhanced image $S_0^{\#2}$ and the post-initial contrast-enhanced image $S_2^{\#2}$. A calibrated contrast enhancement parametric map $IE^{\#1}$ is generated by dividing the contrast enhancement parametric map $IE^{\#2}$ by the calibration factor $k^{\#21}$, and a calibrated contrast enhancement parametric map $PIE^{\#1}$ is generated by dividing the contrast enhancement parametric map $PIE^{\#2}$ by the calibration factor $k^{\#21}$.

Next, the second calibration method will be described. From the signal values $S_0^{\#1}$, $S_1^{\#1}$, $S_2^{\#1}$, $S_p^{\#1}$, $S_{ms1}^{\#1}$, and $S_{ms2}^{\#1}$ acquired under the examination-time imaging condition #1, signal values $S_0^{\#2}$, $S_1^{\#2}$, $S_2^{\#2}$, $S_p^{\#2}$, $S_{ms1}^{\#2}$, and $S_{ms2}^{\#2}$ calibrated to the standard imaging condition #2 are acquired.

The signal value $S_0^{\#1}$ of the calibrated non-contrast-enhanced image is calculated in accordance with equation (42) on the basis of a given parameter value h and the signal value $S_0^{\#2}$ of the non-contrast-enhanced image under the examination-time imaging condition #2. The given parameter value h is defined in accordance with equation (43). The given parameter value h may be set to any value in calculation of a contrast enhancement parameter value.

$$S_0^{\#1} = S_0^{\#2}/h \qquad (42)$$

$$h = m^{\#2}R_{10}^{\#2}/m^{\#1}R_{10}^{\#1} \qquad (43)$$

The signal value $S_1^{\#1}$ of the calibrated initial contrast-enhanced image is calculated in accordance with equation (44) on the basis of the given parameter value h and the signal value $S_1^{\#2}$ of the initial contrast-enhanced image under the examination-time imaging condition #2.

$$S_1^{\#1} = (S_1^{\#2} - S_0^{\#2})/(hk^{b,\#21}) + S_0^{\#2}/h \qquad (44)$$

The signal value $S_2^{\#1}$ of the calibrated post-initial contrast-enhanced image is calculated in accordance with equation (45) on the basis of the given parameter value h and the signal value $S_2^{\#2}$ of the post-initial contrast-enhanced image under the examination-time imaging condition #2.

$$S_2^{\#1} = (S_2^{\#2} - S_0^{\#2})/(hk^{b,\#21}) + S_0^{\#2}/h \qquad (45)$$

The signal value $S_p^{\#1}$ of the calibrated peak contrast-enhanced image is calculated in accordance with equation (46) on the basis of the given parameter value h and the signal value $S_p^{\#2}$ of the peak contrast-enhanced image under the examination-time imaging condition #2.

$$S_p^{\#1} = (S_p^{\#2} - S_0^{\#2})/(hk^{b,\#21}) + S_0^{\#2}/h \qquad (46)$$

The signal value $S_{ms1}^{\#1}$ of the calibrated pre-maximum slope image is calculated in accordance with equation (47) on the basis of the given parameter value h and the signal value $S_{ms1}^{\#2}$ of the pre-maximum slope image under the examination-time imaging condition #2.

$$S_{ms1}^{\#1} = (S_{ms1}^{\#2} - S_0^{\#22})/(hk^{b,\#21}) + S_0^{\#2}/h \qquad (47)$$

The signal value $S_{ms2}^{\#1}$ of the calibrated post-maximum slope image is calculated in accordance with equation (48) on the basis of a given parameter value h and the signal value $S_{ms2}^{\#2}$ of the post-maximum slope image under the examination-time imaging condition #2.

$$S_{ms2}^{\#1} = (S_{ms2}^{\#2} - S_0^{\#2})/(hk^{b,\#21}) + S_0^{\#2}/h \qquad (48)$$

Various calibrated contrast enhancement parametric maps are calculated based on the signal values $S_0^{\#2}$, $S_1^{\#2}$, $S_2^{\#2}$, $S_p^{\#2}$, $S_{ms1}^{\#2}$, and $S_{ms2}^{\#2}$ of the various calibrated contrast-enhanced images.

Figure 7:
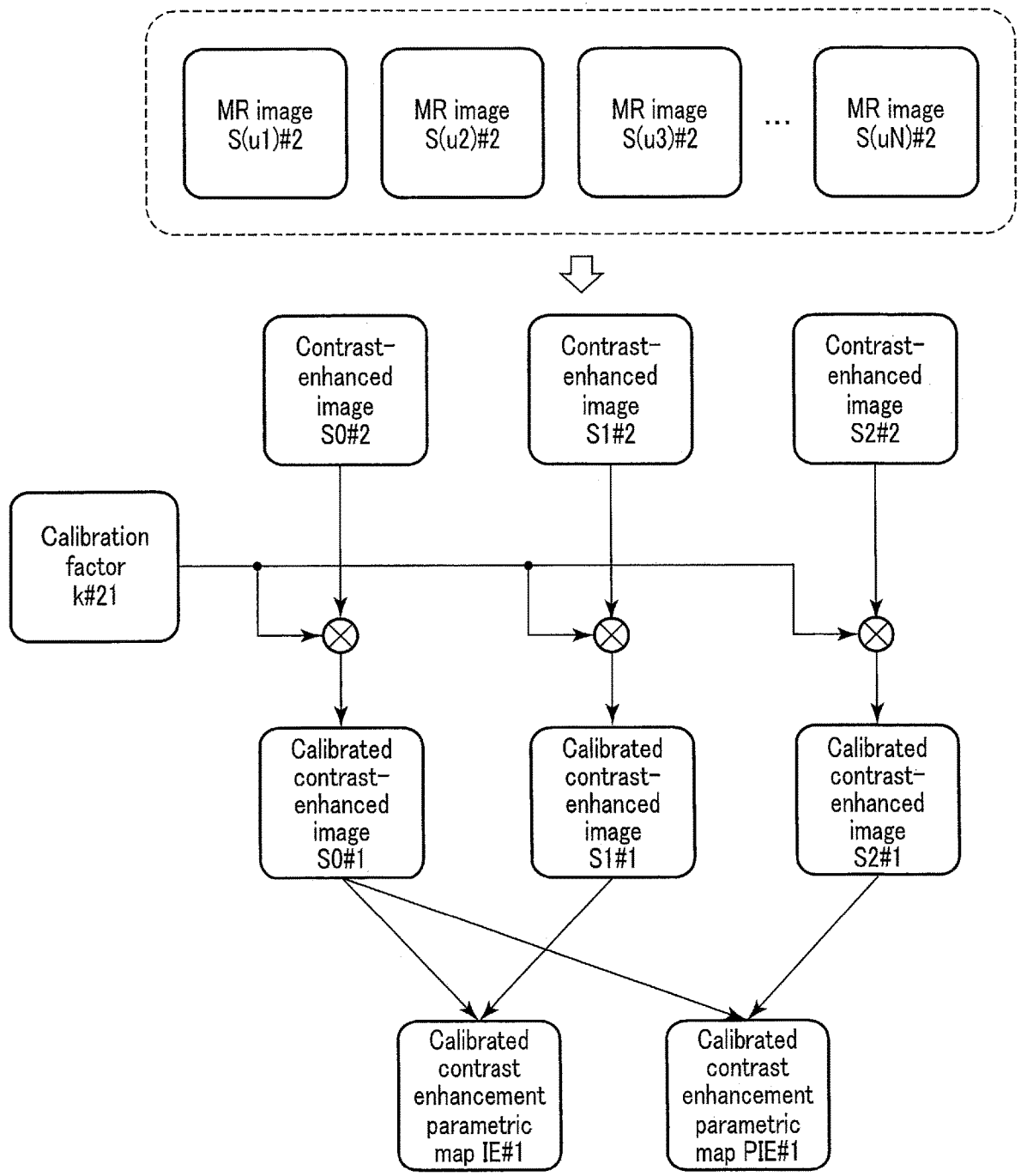
FIG. 7 is a diagram schematically showing a process of a second calibration method of a calibrated contrast enhancement parametric map.

FIG. 7 is a diagram schematically showing a process of the second calibration method of a calibrated contrast enhancement parametric map. In FIG. 7, the contrast enhancement parameter values are assumed to be IE and PIE. As shown in FIG. 7, MR images $S(u1), \ldots,$ and $S(uN)$ of multiple times $u1,$ and $uN$ generated under the examination-time imaging condition #2 are obtained. Based on the first dynamic MR images $S(u1)$ and $S(uN)$ of multiple times u1, . . . , and uN, a non-contrast-enhanced image $S_0^{\#2}$ is generated in accordance with equation (1), an initial contrast-enhanced image $S_1^{\#2}$ is generated in accordance with equation (2), and a post-initial contrast-enhanced image $S_2^{\#2}$ is generated in accordance with equation (3). A calibrated non-contrast-enhanced image $S_0^{\#1}$ is generated by dividing the non-contrast-enhanced image $S_0^{\#2}$ by the calibration factor $k^{\#21}$, a calibrated initial contrast-enhanced image $S_1^{\#1}$ is generated by dividing the initial contrast-enhanced image $S_1^{\#2}$ by the calibration factor $k^{\#21}$, and a calibrated post-initial contrast-enhanced image $S_2^{\#1}$ is generated by dividing the post-initial contrast-enhanced image $S_2^{\#2}$ by the calibration factor $k^{\#21}$. A calibrated contrast enhancement parametric map $IE^{\#1}$ relating to the contrast enhancement parameter IE is generated in accordance with equation (6) on the basis of the calibrated non-contrast-enhanced image $S_0^{\#1}$ and the calibrated initial contrast-enhanced image $S_1^{\#1}$, and a calibrated contrast enhancement parametric map $PIE^{\#1}$ relating to the contrast enhancement parameter PIE is generated in accordance with equation (7) on the basis of the calibrated non-contrast-enhanced image $S_0^{\#1}$ and the calibrated post-initial contrast-enhanced image $S_2^{\#1}$.

The above-described calibration methods of a calibrated contrast enhancement parametric map are merely examples of calibration; for example, it is possible to generate calibrated MR images by multiplying MR images by a calibration factor, generate calibrated contrast-enhanced images on the basis of the calibrated MR images, and generate a calibrated contrast enhancement parametric map on the basis of the calibrated contrast-enhanced images.

After step S4, the processing circuitry 11 calculates, through implementation of the statistic calculation function 114, statistics on the basis of the contrast enhancement parameter values (step S5). In step S5, the processing circuitry 11 sets a region of interest in the contrast enhancement parametric map. The region of interest is set to include a region of a lesion such as a tumor. The lesion region may be extracted by the processing circuitry 11 using a given type of image recognition processing. Alternatively, the region of interest may be manually set in accordance with a command input by the user through the input interface 14. For example, the user observes the contrast enhancement parametric map displayed on the display 13 and identifies a lesion region, and positions a region of interest mark of a predetermined shape, such as a circle, or an arbitrary shape so that the mark includes the lesion region. The processing circuitry 11 sets the pixels surrounded by the region of interest mark as a region of interest. There may be a single region of interest or a plurality of regions of interest.

Upon setting of the region of interest, the processing circuitry 11 calculates a statistic on the basis of contrast enhancement parameter values of the pixels included in the region of interest. As the statistics, any statistic value such as an average value, standard deviation, a median, a maximum value, a minimum value, or a percentile may be selected in accordance with the purpose. Alternatively, various primary or secondary statistics using a gray level co-occurrence matrix (GLCM) may be selected as the statistics in accordance with purpose. A statistic value may be calculated by selecting one type from those statistics, or may be calculated by selecting two or more types therefrom.

When there are a plurality of regions of interest, a statistic value is calculated for each region of interest. The statistics need not be necessarily calculated based on the pixels in the region of interest, and may be calculated based on all the pixels of the contrast enhancement parametric map.

After step S5 is performed, the processing circuitry 11 causes, through implementation of the display control function 115, the display 13 to display the contrast enhancement parameter values calculated in step S4 and the statistic values calculated in step S5 (step S6). For example, the display 13 displays side by side the calibrated contrast enhancement parametric map on which the region of interest is rendered, at the left side, and the statistic values at the right side. A color value corresponding to the contrast enhancement parameter value is assigned to each pixel of the calibrated contrast enhancement parametric map. The display 13 can display the color-coded image of calibrated contrast enhancement parametric map. A color bar indicating the correspondence between contrast enhancement parameter values and color values can be discretionarily changed in accordance with a command or the like input by the user through the input interface 14, or the like. In other example, a gray value corresponding to the contrast enhancement parameter value may be assigned to each pixel of the calibrated contrast enhancement parametric map. In this case, the display 13 can display the calibrated contrast enhancement parametric map in grayscale.

For example, the statistic values are calculated in step S5 for each combination of a type of statistics and region of interest defined at different places. In this case, the display 13 should display those statistics in tabular format in which the statistics are classified by the type of statistics and the place where the region of interest is set.

The user performs a diagnosis or the like through examination of the contrast enhancement parametric map and/or statistics displayed on the display 13. The present embodiment enables calculation of contrast enhancement parameter values converted from the examination-time imaging condition to the standard imaging condition or statistics based on the contrast enhancement parameter values, and thus improves the quantitativity of those values. For example, when a diagnosis is performed on a plurality of MR examinations, contrast enhancement parameter values or statistics are converted to values or a value under the standard imaging condition for each MR examination; therefore, quantitative determination can be made over the MR examinations by using calibrated values of the contrast enhancement parameter values or statistics, although the different acquisition conditions were used in MR examinations.

This is the end of the description of the analysis processing of time-series MR images by the medical image processing apparatus 1 shown in FIG. 4.

The above analysis processing shown in FIG. 4 is an example, and can be modified in various ways.

For example, setting of the imaging conditions (step S2) and calculation of the calibration factor (step S3) may be performed in a preceding stage of acquisition of MR images (step S1), or a subsequent stage thereof.

In the above-described analysis processing, the calibration factor is calculated based on the examination-time imaging condition and the standard imaging condition, and calibrated parameter values are calculated based on multiple-time MR images and the calibration factor; however, the present embodiment is not limited to this. The calibrated parameter values may be calculated based on the examination-time imaging condition, the standard imaging condition, and the multiple-time MR images without calculation of a calibration factor. For example, as long as various imaging condition parameters necessary for calculation of a calibration factor are acquired, calibrated parameter values can be calculated based on the imaging conditions and multiple-time MR images. The various imaging condition parameters necessary for calculation of a calibration factor are the contrast agent concentration ratio, contrast agent relaxivity ratio, and tissue relaxivity ratio as shown in equation (30) in the calibration factor determination example 1, and are the contrast enhancement differential ratio $E^{a,\#1}$ of the reference tissue of the tissue information relating to the standard imaging condition, the contrast enhancement differential ratio $E^{a,\#2}$ of the reference tissue of the tissue information relating to the examination-time imaging condition, the tissue relaxivity ratio $k_{10}^{b,\#2}$ of the object tissue, and the tissue relaxivity ratio $k_{10}^{a,\#2}$ of the reference tissue as shown in equation (31) in the calibration factor determination example 2.

According to the above-described embodiment, the medical image processing apparatus 1 includes processing circuitry 11. The processing circuitry 11 obtains multiple-time MR images acquired by MR imaging on a subject, in which a contrast agent has been injected, in accordance with an examination-time imaging condition including magnetic field information, contrast agent information, and/or tissue information. The processing circuitry 11 sets a standard imaging condition including magnetic field information, contrast agent information and/or tissue information. The processing circuitry 11 calculates calibrated contrast enhancement parameter values each indicating a temporal change of an MR signal value caused by a contrast agent, which has been converted from the examination-time imaging condition to the standard imaging condition, on the basis of the multiple-time MR images, the examination-time imaging condition, and the standard imaging condition.

The above configuration enables conversion of contrast-enhanced images, contrast enhancement parameter values, and statistics to those under the same standard imaging condition even if the examination-time imaging condition is different between contrast-enhanced MR examinations. Accordingly, the dependency of the contrast-enhanced images, contrast enhancement parameter values, and statistics on the contrast agent type, injection amount, imaging condition, and magnetic field strength is reduced, and the quantitativity of the contrast enhancement parameter values and statistics is improved; accordingly, diagnosis accuracy is improved.

(Modification)

In the above embodiment, the tissue relaxivity under the standard imaging condition is determined based on the tissue relaxivity under the examination-time imaging condition and the LUT. However, the present embodiment is not limited to this. Processing circuitry 11 according to a modification calculates a tissue relaxivity under the standard imaging condition on the basis of T1 mapping.

From equations (29) and (30), the calibration factor $k^{b,\#21}$ can be expressed as equation (49). Through implementation of the index value calculation function 113, the processing circuitry 11 according to the modification calculates the calibration factor $k^{b,\#21}$ in accordance with equation (49).

$$k^{b,\#21} = k_c^{\#2} k_1^{\#2} \frac{R_{10}^{b,\#1}}{R_{10}^{b,\#2}} \qquad (49)$$

Figure 8:
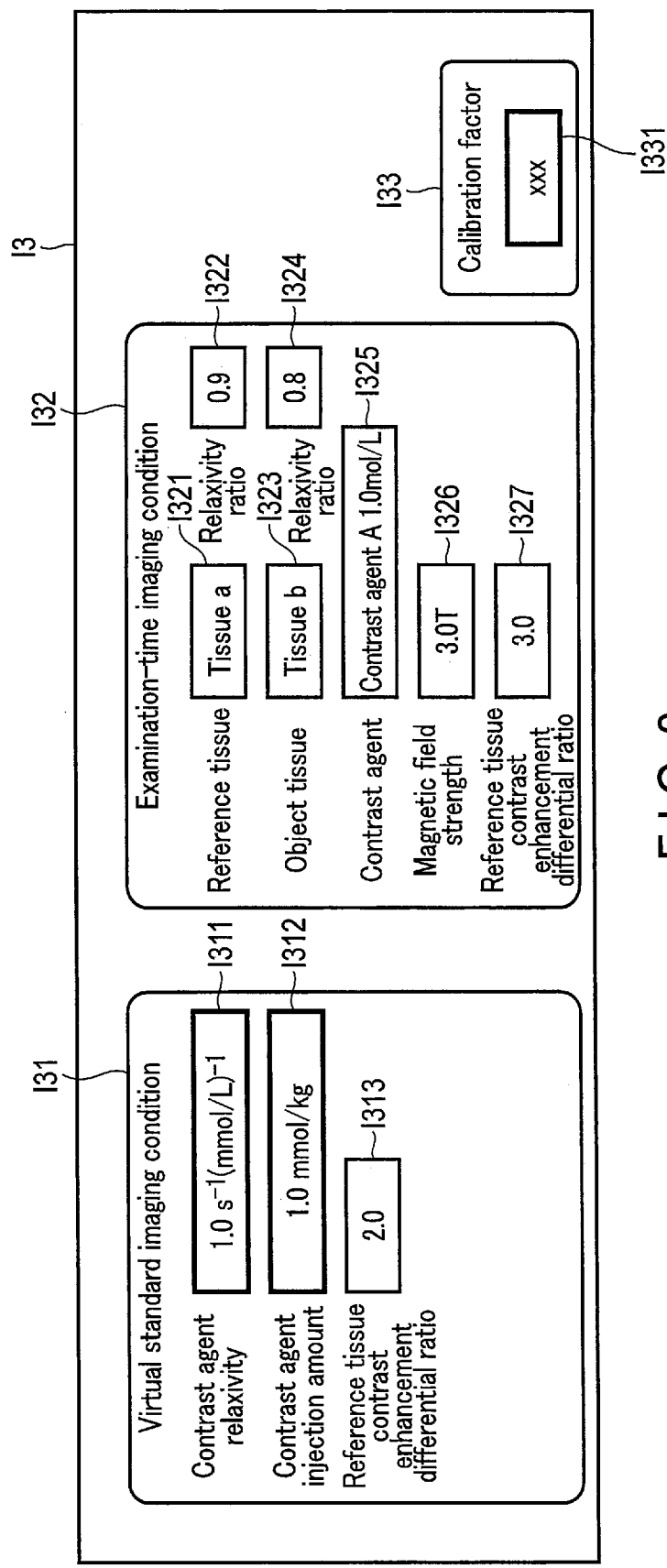
FIG. 8 is a diagram showing an example of an input window of imaging conditions according to a modification.

FIG. 8 is a diagram showing an example of an input window 13 according to the modification. As shown in FIG. 8, the input window 13 includes a field I31 of virtual standard imaging condition, a field I32 of examination-time imaging condition, and a display field I33 of calibration factor. The input window 13 is displayed on the display 13 by the processing circuitry 11. The field I31 of virtual standard imaging condition includes a field I311 of contrast agent relaxivity, a field I312 of contrast agent injection amount, and a field I313 of reference tissue contrast enhancement differential ratio. The field I32 of examination-time imaging condition includes a field I321 of reference tissue type, a field I322 of reference tissue relaxivity ratio, a field I323 of object tissue type, a field I324 of object tissue relaxivity ratio, a field I325 of contrast agent type, a field I326 of magnetic field strength, and a field I327 of reference tissue contrast enhancement differential ratio. The display field I33 of calibration factor includes a field I331 of calibration factor.

First, a tissue relaxivity $R_{10}^{b,\#1}$ under the standard imaging condition is set. The tissue relaxivity $R_{10}^{b,\#1}$ under the standard imaging condition is set based on the LUT and the object tissue under the examination-time imaging condition set in the input window I3 of FIG. 8, as in the input window I1. The processing circuitry 11 generates a T1 map indicating spatial distribution of T1 values, through a T1 mapping method, from variable TR or variable flip angle images imaged in the same examination as the measurement object image. The processing circuitry 11 sets a region of interest including a measurement object tissue in the T1 map. The processing circuitry 11 calculates an average value of T1 values allocated to a plurality of pixels included in the region of interest as the tissue relaxivity $R_{10}^{b,\#2}$ under the examination-time imaging condition.

Next, the processing circuitry 11 obtains a contrast agent type, a contrast agent injection amount, and a magnetic field strength from the header information or DICOM tag of an MR image.

Then, the processing circuitry 11 calibrates contrast enhancement parameter values to a virtual standard imaging condition. Specifically, the virtual standard imaging condition is an imaging condition which makes the contrast agent relaxivity 1 through injection of a unit amount of a contrast agent. A virtual condition in which a tissue with tissue relaxivity 1 is imaged as a reference tissue will be considered. Namely, the case of $r_1^{\#1}=1\ s^{-1}\ (mmol/L)^{-1}$, $c^{a,\#1} = d^{a,\#1} I^{\#1} = d^{a,\#1}$ (i.e., $I^{\#1}=1$), and $R_{10}^{a,\#1}=1(s^{-1})$ will be considered. $I^{\#1}$ is a contrast agent injection amount per unit weight (mmol/kg), and $d^{b,\#1}$ is a tissue contrast agent concentration per unit contrast agent injection amount (kg/L). When these are substituted into equation (18), the virtual reference tissue contrast enhancement differential ratio $e^{a,\#1}$ under this imaging condition is expressed by equation (50).

$$e^{a,\#1} = \frac{S^{a,\#1}}{S_0^{a,\#1}} - 1 \approx \frac{c^{a,\#1} r_1^{\#1}}{R_{10}^{a,\#1}} = d^{a,\#1} \qquad (50)$$

At this time, the reference tissue contrast enhancement differential ratio $e^{a,\#2}$ under the examination-time imaging condition #2 is expressed by equations (51) and (52). The calibration factor $[k^{a,\#21}]$ is expressed by equation (53).

$$e^{a,\#2} = \frac{S^{a,\#2}}{S_0^{a,\#2}} - 1 \approx \frac{d^{a,\#2} I^{\#2} r_1^{\#2}}{R_{10}^{a,\#2}} = \frac{I^{\#2} r_1^{\#2}}{R_{10}^{a,\#2}} d^{a,\#2} = [k^{a,\#21}] e^{a,\#1} \qquad (51)$$

$$e^{a,\#1} = e^{a,\#2} / [k^{a,\#21}] \qquad (52)$$

$$[k^{a,\#21}] = \frac{I^{\#2} r_1^{\#2}}{R_{10}^{a,\#2}} \qquad (53)$$

The contrast enhancement differential ratio $e^{b,\#2}$ of a measurement object tissue b under the same virtual imaging condition is expressed by equation (54) on the basis of equation (23). Note that $e^{b,\#2}=d^{b,\#1}I^{\#1}=d^{b,\#1}$.

$$e^{b,\#1} = \frac{S^{b,\#1}}{S_0^{b,\#1}} - 1 \approx \frac{c^{b,\#1}r_1^{\#1}}{R_{10}^{b,\#1}} = \frac{d^{b,\#1}r_1^{\#1}}{R_{10}^{b,\#1}} \quad (54)$$

$$c^{b,\#1} = d^{b,\#1}I^{\#1} = d^{b,\#1}$$

The contrast enhancement differential ratio $e^{b,\#2}$ of the measurement object tissue b under the examination-time imaging condition is expressed by equations (55) and (56) on the basis of the contrast agent injection amount $I^{\#2}$. Note that $c^{b,\#2}=d^{b,\#2}I^{\#2}$.

$$e^{b,\#2} = \frac{S^{b,\#2}}{S_0^{b,\#2}} - 1 \approx \frac{c^{b,\#2}r_1^{\#2}}{R_{10}^{b,\#2}} = \frac{I^{\#2}r_1^{\#2}}{R_{10}^{b,\#2}}d^{b,\#2} = [k^{b,\#21}]e^{b,\#1} \quad (55)$$

$$e^{b,\#1} = \frac{1}{[k^{b,\#21}]}e^{b,\#2} \quad (56)$$

The calibration factor $[k^{b,\#21}]$ is calculated in accordance with equation (57) on the basis of the tissue relaxivity $R_{10}^{b,\#1}$ under the standard imaging condition and the tissue relaxivity $R_{10}^{b,\#2}$ under the examination-time imaging condition. The calculated calibration factor is shown in the field I33 of calibration factor.

$$[k^{b,\#21}] = \frac{I^{\#2}r_1^{\#2}}{R_{10}^{b,\#2}} = \frac{I^{\#2}r_1^{\#2}}{R_{10}^{a,\#2}}\frac{R_{10}^{a,\#2}}{R_{10}^{b,\#2}} = [k^{a,\#21}]/\frac{R_{10}^{a,\#2}}{R_{10}^{b,\#2}} \quad (57)$$

Since the tissue relaxivity $R_{10}^{b,\#2}$ is acquired by T1 mapping, the input window I3 in FIG. 8 enables omission of many setting items of the standard imaging condition and can simplify the setting operation in comparison with the input window I1 in FIG. 3 and the input window I2 in FIG. 4.

According to at least one of the above-explained embodiments, it is possible to improve accuracy and/or efficiency of diagnosis using contrast enhancement parameters based on MR images.

The term "processor" used in the above description means, for example, a CPU, a GPU, or circuitry such as an application specific integrated circuit (ASIC), a programmable logic device (e.g., a simple programmable logic device (SPLD), a complex programmable logic device (CPLD), or a field programmable gate array (FPGA)). The processor implements functions by reading and executing a program stored in memory circuitry. Instead of storing a program in memory circuitry, a program may be directly integrated into circuitry of the processor. In this case, the processor implements functions by reading and executing the program integrated in the circuitry. The function corresponding to the program may be implemented by a combination of logic circuits instead of executing the program. The processors described in connection with the above embodiments are not limited to single-circuit processors; a plurality of independent processors may be integrated into a single processor that implements the functions of the processors. In addition, a plurality of structural elements in FIG. 1 may be integrated in one processor to implement the functions of the structural elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A medical image processing apparatus comprising processing circuitry configured to:

obtain first dynamic MR images acquired by MR imaging on a subject, in which a contrast agent has been injected, in accordance with an examination-time imaging condition including magnetic field information, contrast agent information, and/or tissue information;

set a standard imaging condition including magnetic field information, contrast agent information, and/or tissue information; and calculate a first index value indicating a temporal change of an MR signal value caused by the contrast agent, the first index value being standardized by conversion from the examination-time imaging condition to the standard imaging condition based on the first dynamic MR images, the examination-time imaging condition, and the standard imaging condition.

2. The medical image processing apparatus according to claim 1, wherein the processing circuitry is further configured to:

calculate a second index value relating to the examination-time imaging condition, which indicates a temporal change of an MR signal value caused by the contrast agent, based on the first dynamic MR images; and calculate the first index value based on the second index value, the examination-time imaging condition, and the standard imaging condition.

3. The medical image processing apparatus according to claim 1, wherein the processing circuitry is further configured to:

calculate pixel values of multiple-time second MR images obtained by conversion from the examination-time imaging condition to the standard imaging condition, based on the first dynamic MR images, the examination-time imaging condition, and the standard imaging condition; and calculate the first index value based on the pixel values of the multiple-time second MR images, the examination-time imaging condition, and the standard imaging condition.

4. The medical image processing apparatus according to claim 1, wherein the processing circuitry is further configured to:

calculate a calibration factor based on the examination-time imaging condition and the standard imaging condition; and calculate the first index value based on the calibration factor and the first dynamic MR images.

5. The medical image processing apparatus according to claim 4, wherein the calibration factor is calculated based on a contrast agent concentration ratio, a contrast agent relaxivity ratio, and a tissue relaxivity ratio, the contrast agent concentration ratio is a ratio between a contrast agent injection amount of contrast agent information relating to the examination-time imaging condition and a contrast agent injection amount of contrast agent information relating to the standard imaging condition, the contrast agent relaxivity ratio is a ratio between a contrast agent relaxivity of the contrast agent information relating to the examination-time imaging condition and a contrast agent relaxivity of the contrast agent information relating to the standard imaging condition, and the tissue relaxivity ratio is a ratio between a tissue relaxivity of tissue information relating to the examination-time imaging condition and a tissue relaxivity of tissue information relating to the standard imaging condition.

6. The medical image processing apparatus according to claim 5, wherein the processing circuitry is further configured to set the tissue relaxivity relating to the standard imaging condition, based on a T1 value acquired by T1 mapping.

7. The medical image processing apparatus according to claim 4, wherein the calibration factor is calculated based on a contrast enhancement differential ratio of a reference tissue of tissue information relating to the standard imaging condition, a contrast enhancement differential ratio of the reference tissue of tissue information relating to the examination-time imaging condition, a tissue relaxivity ratio of the reference tissue, and a tissue relaxivity ratio of an object tissue, the tissue relaxivity ratio of the reference tissue is a ratio between a tissue relaxivity of the reference tissue of the tissue information relating to the examination-time imaging condition and a tissue relaxivity of the reference tissue of the tissue information relating to the standard imaging condition, and the tissue relaxivity ratio of the object tissue is a ratio between a tissue relaxivity of the object tissue of the tissue information relating to the examination-time imaging condition and a tissue relaxivity of the object tissue of the tissue information relating to the standard imaging condition.

8. The medical image processing apparatus according to claim 7, wherein the processing circuitry is further configured to set the contrast enhancement differential ratio of the reference tissue, based on a signal value of a region of interest set in the reference tissue.

9. The medical image processing apparatus according to claim 4, wherein the processing circuitry is further configured to cause a display to display the calibration factor.

10. The medical image processing apparatus according to claim 1, wherein the processing circuitry is further configured to:

calculate a statistic based on the first index value; and cause a display to display the statistic.

11. The medical image processing apparatus according to claim 1, wherein the processing circuitry is further configured to:

cause a display to display an input window for inputting values of the examination-time imaging condition and/or the standard imaging condition; and set the examination-time imaging condition and/or the standard imaging condition in accordance with the values input to the input window.

12. The medical image processing apparatus according to claim 1, wherein the magnetic field information is a magnetic field strength, the contrast agent information is a type, injection amount, and relaxivity of the contrast agent, and the tissue information is a type and relaxivity of a tissue.

13. The medical image processing method comprising:

obtaining multiple-time MR images acquired by MR imaging on a subject, in which a contrast agent has been injected, in accordance with an examination-time imaging condition including magnetic field information, contrast agent information, and/or tissue information;

setting a standard imaging condition including magnetic field information, contrast agent information, and/or tissue information; and calculating a first index value indicating a temporal change of an MR signal value caused by the contrast agent, the first index value being standardized by conversion from the examination-time imaging condition to the standard imaging condition based on the multiple-time MR images, the examination-time imaging condition, and the standard imaging condition.

* * * * *